United States Patent
Inoue et al.

(10) Patent No.: US 6,669,830 B1
(45) Date of Patent: Dec. 30, 2003

(54) SPUTTERING TARGET, TRANSPARENT CONDUCTIVE OXIDE, AND PROCESS FOR PRODUCING THE SPUTTERING TARGET

(75) Inventors: Kazuyoshi Inoue, Minato-ku (JP); Tadao Shibuya, Sodegaura (JP); Akira Kaijo, Minato-ku (JP)

(73) Assignee: Idemitsu Kosan Co., Ltd. (JP)

( * ) Notice: Subject to any disclaimer, the term of this patent is extended or adjusted under 35 U.S.C. 154(b) by 0 days.

(21) Appl. No.: 10/089,378

(22) PCT Filed: Nov. 22, 2000

(86) PCT No.: PCT/JP00/08236

§ 371 (c)(1),
(2), (4) Date: Mar. 29, 2002

(87) PCT Pub. No.: WO01/38599

PCT Pub. Date: May 31, 2001

(30) Foreign Application Priority Data

| Nov. 25, 1999 | (JP) | 11/333730 |
| Nov. 25, 1999 | (JP) | 11/333731 |
| Feb. 4, 2000 | (JP) | 2000-27741 |
| Feb. 21, 2000 | (JP) | 2000-42378 |
| Apr. 13, 2000 | (JP) | 2000-111505 |
| Apr. 20, 2000 | (JP) | 2000-118924 |

(51) Int. Cl.$^7$ .......... C23C 14/34; F27B 14/00; H01L 21/4763

(52) U.S. Cl. .......... 204/298.13; 432/13; 438/618; 438/622; 438/624

(58) Field of Search .......... 204/298.13; 432/13; 423/618, 622, 624

(56) References Cited

U.S. PATENT DOCUMENTS

| 5,972,527 A | 10/1999 | Kaijou et al. | 428/697 |
| 6,534,183 B1 * | 3/2003 | Inoue | 428/432 |

FOREIGN PATENT DOCUMENTS

| JP | 03-050148 | 3/1991 | C04B/35/00 |
| JP | 05-070943 | 3/1993 | C23C/14/34 |
| JP | 05-155651 | 6/1993 | C04B/35/00 |
| JP | 06-234565 | 8/1994 | C04B/35/00 |
| JP | 06-318406 | 11/1994 | H01B/5/14 |
| JP | 07-243036 | 9/1995 | C23C/14/34 |
| JP | 07-333438 | 12/1995 | G02B/5/30 |
| JP | 07-335046 | 12/1995 | H01B/13/00 |
| JP | 08-283934 | 10/1996 | C23C/14/34 |
| JP | 09-071860 | 3/1997 | C23C/14/34 |

OTHER PUBLICATIONS

English translation of JP 6–318406.*
English translation of JP 9–71860.*
English translation of JP 7–243036.*
English translation of JP 7–333438.*
English translation of JP 7–335046.*

* cited by examiner

*Primary Examiner*—Steven H. Ver Steeg
(74) *Attorney, Agent, or Firm*—Parkhurst & Wendel, L.L.P.

(57) ABSTRACT

In a sputtering target comprising at least indium oxide and zinc oxide, the atomic ratio represented by In/(In+Zn) is set to a value within the range of 0.75 to 0.97, a hexagonal layered compound represented by $In_2O_3(ZnO)_m$ wherein m is an integer of 2 to 20 is contained, and the crystal grain size of the hexagonal layered compound is set to a value of 5 $\mu$m or less.

23 Claims, 13 Drawing Sheets

FIG. 6(a)   FIG. 6(b)   FIG. 6(c)   FIG. 6(d)
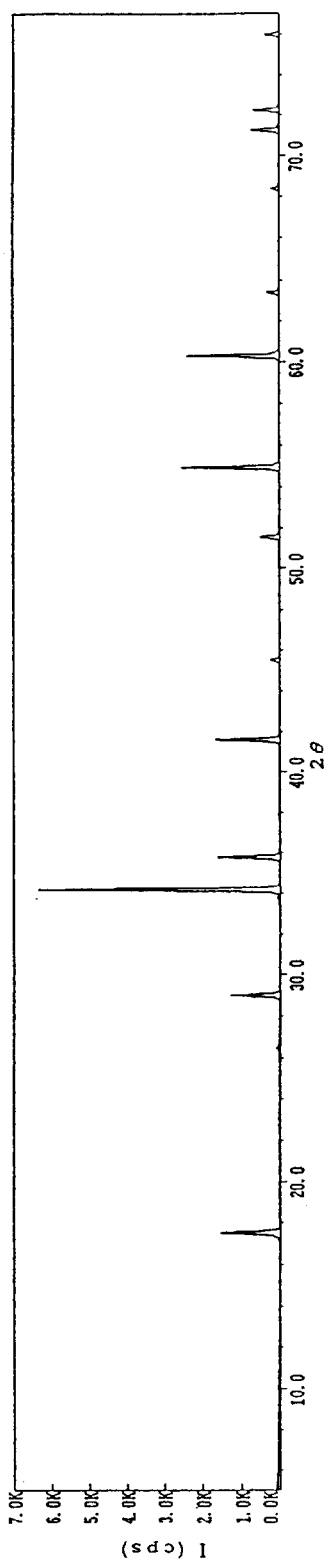
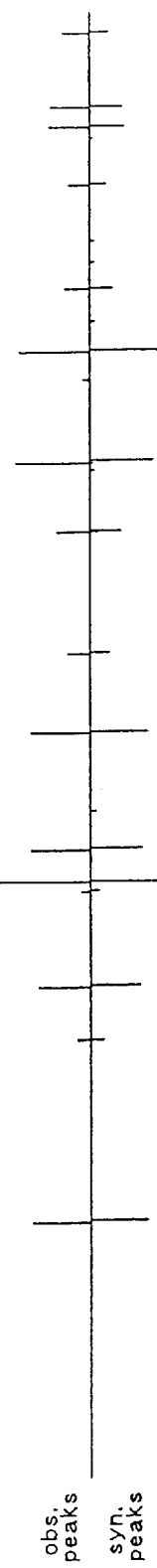
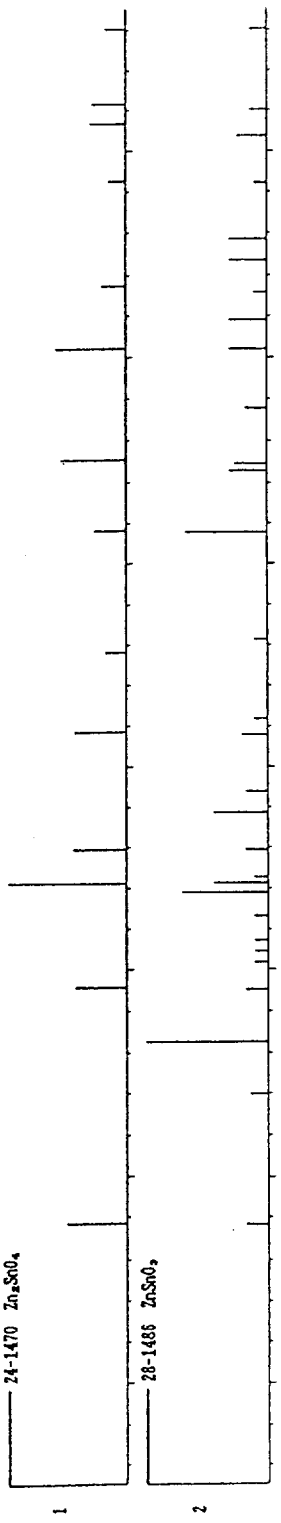

Heat treatment temperature (°C)

SPUTTERING TARGET, TRANSPARENT CONDUCTIVE OXIDE, AND PROCESS FOR PRODUCING THE SPUTTERING TARGET

TECHNICAL FIELD

The present invention relates to a sputtering target (which may be referred to merely as a target hereinafter), a transparent conductive oxide made of the sputtering target, and a process for producing the sputtering target.

The present invention relates particularly to a target making it possible to suppress nodules generated when sputtering is used to form a transparent conductive oxide into a film, and to make the sputtering stable, a transparent conductive oxide made of such a target, and a process for producing such a target.

BACKGROUND ART

In recent years, display devices have been remarkably developed. Liquid crystal display devices (LCD), electroluminescence display devices (EL), field emission displays (FED) or the like are used as display devices for office machines such as personal computers and word processors, or for control systems in factories. These display devices have a sandwich structure wherein a display element is sandwiched between transparent conductive oxides.

As such transparent conductive oxides, indium tin oxide (which may be referred to ITO hereinafter) formed into a film by sputtering, ion plating or vapor deposition accounts for the main current, as disclosed in document 1: "Technology on Transparent Conductive Film" (published by Ohm-sha Ltd., 166th committee on transparent oxides and photoelectric materials in Japan Society for the Promotion of Science, 1999).

Such ITO is made of indium oxide and tin oxide of given amounts and is characterized by having superior transparency and conductivity, being capable of being etched with a strong acid, and having good adhesion to a substrate.

In the meantime, as disclosed in JP-A-3-50148, JP-A-5-155651, JP-A-5-70943, JP-A-6-234565 and so on, there is known a target made of indium oxide, tin oxide and zinc oxide of given amounts, or a transparent electrode made from such a target into a film (which may be referred to as IZO hereinafter). This can be etched with a weak acid, and is widely used because it has good sinterability and transparency.

As described above, ITO or IZO has superior performances as the material of a transparent conductive oxide, but has a problem that when a target is used to form ITO or IZO into a film, nodules (swellings) as shown in FIG. 2 (photograph) are easily generated in the surface of the target.

Particularly when an amorphous ITO film is formed to improve etching property, there arises a problem that the surface of a target is reduced because of a very small amount of water or hydrogen gas introduced into a sputtering chamber for the deposition, so that nodules are more easily generated.

When such nodules are generated in the surface of the target, the nodules are easily scattered by power of plasma during the sputtering. As a result, there arises a problem that the scattered substances adhere, as alien substances, to the transparent conductive oxide during or immediately after the formation of the film.

The nodules generated in the surface of this target account for one of causes of abnormal electric discharge.

Thus, as disclosed in JP-A-8-283934, as measures for suppressing the generation of nodules in a target, efforts are made to reduce pores by making the material of the target denser through sintering at high temperature. That is, a target having a 99%-density relative to the theoretical density thereof is produced, but even in this case nodules cannot be completely removed.

In such a situation, it is desired to develop a target making it possible to suppress the generation of nodules when a film is formed by sputtering and make the sputtering stable.

Thus, the present inventors made eager investigations repeatedly to solve the above-mentioned problems. As a result, the inventors have found out that nodules generated in the surface of a target are basically the remainders of excavation and the cause for generating this remainder of excavation depends on the value (for example, 10 $\mu$m or more) of the crystal grain size of metal oxides constituting the target.

Namely, in the case that a target is struck out from the surface thereof by sputtering, the speeds of the striking-out are different dependently on the directions of crystal planes so that unevenness is generated in the surface of the target. It has been proved that the size of the unevenness depends on the crystal grain size of metal oxides present in the sintered body.

Therefore, it can be considered that when a target made of a sintered body having a large crystal grain size is used, unevenness generated in the surface of the target gradually gets larger so that nodules are generated from the convex portions of the unevenness.

That is, an object of the present invention is to provide a target making it possible to suppress nodules generated when a transparent conductive oxide is formed into a film by sputtering, and to make the sputtering stable, a transparent conductive oxide made of such a target, and a process for producing such a target.

DISCLOSURE OF THE INVENTION

[1] According to the present invention, provided is a sputtering target comprising at least indium oxide and zinc oxide, wherein the atomic ratio represented by In/(In+Zn) is set to a value within the range of 0.75 to 0.97, a hexagonal layered compound represented by $In_2O_3(ZnO)_m$ wherein m is an integer of 2 to 20 is contained, and the crystal grain size of the hexagonal layered compound is set to a value of 5 $\mu$m or less.

That is, by limiting the value of the crystal grain size into the given range, the size of unevenness generated in the surface of the target is controlled so that the generation of nodules can be effectively suppressed.

[2] When the sputtering target of the present invention is constructed, it is preferred that 67 to 93% by weight of indium oxide, 5 to 25% by weight of tin oxide and 2 to 8% by weight of zinc oxide are contained, and the atomic ratio of tin to zinc is set to a value of 1 or more.

Such a construction makes the target dense and makes it possible to suppress the generation of nodules more effectively.

By setting the atomic ratio of tin to zinc to a value of 1 or more in this way, the electric resistance after crystallization is effectively lowered so that a transparent conductive oxide having superior conductivity can be obtained.

[3] When the sputtering target of the present invention is constructed, it is preferred that a spinel structural compound represented by $Zn_2SnO_4$ is contained instead of the hexagonal layered compound or together with the hexagonal layered compound, and the crystal grain size of the spinel structural compound is set to a value of 5 μm or less.

Such a construction makes the target dense so that the generation of nodules can be more effectively suppressed.

Such a construction also makes it possible to yield a transparent conductive oxide having superior transparency and conductivity by sputtering.

[4] When the sputtering target of the present invention is constructed, it is preferred that the bulk resistance thereof is set to a value less than $1 \times 10^{-3}$ Ω·cm.

Such a construction makes it possible to reduce abnormal electric discharge (spark) during the sputtering and yield a sputtering film stably. Conversely, if the bulk resistance is a value of $1 \times 10^{-3}$ Ω·cm or more, charges are accumulated in the surface of the target so that abnormal electric discharge is easily generated.

[5] When the sputtering target of the present invention is constructed, it is preferred that the density thereof is set to a value of 6.7 g/cm$^3$ or more.

Such a construction makes it possible to give superior mechanical property, and makes the target dense, whereby the generation of nodules can be more effectively suppressed.

[6] Another embodiment of the present invention is a transparent conductive oxide (amorphous transparent conductive oxide) comprising a sputtering target wherein the atomic ratio represented by In/(In+Zn) is set to a value within the range of 0.75 to 0.97, a hexagonal layered compound represented by $In_2O_3(ZnO)_m$ wherein m is an integer of 2 to 20 is contained, and the crystal grain size of the hexagonal layered compound is set to a value of 5 μm or less.

Such a construction makes it possible to yield an amorphous transparent conductive oxide good in transparency and conductivity effectively.

[7] When the transparent conductive oxide of the present invention is constructed, it is preferred that 67 to 93% by weight of indium oxide, 5 to 25% by weight of tin oxide and 2 to 8% by weight of zinc oxide are contained in the sputtering target, and the atomic ratio of tin to zinc is set to 1 or more.

Such a construction makes it possible to yield an amorphous transparent conductive oxide good in transparency and conductivity effectively. [8] The transparent conductive oxide of the present invention is preferably crystallized at a temperature of 230° C. or higher.

Such a construction makes it possible to yield an amorphous transparent conductive oxide better in transparency and conductivity effectively.

Even if the oxide is formed on a substrate, the fear that the substrate is damaged becomes small according to such a temperature.

[9] When the transparent conductive oxide of the present invention is constructed, it is preferred that the half band width of a binding energy peak of the oxygen 1S orbit measured by X-ray photoelectron spectrometer (XPS) is set to a value of 3 eV or less.

Such a construction makes it possible to yield an amorphous transparent conductive oxide good in transparency and conductivity effectively.

[10] When the transparent conductive oxide of the present invention is constructed, it is preferred that the transparent conductive oxide is formed on a substrate or on a colored layer disposed on the substrate.

Such a construction makes it possible to provide a transparent electrode or a transparent electrode having a color filter effectively.

[11] When the transparent conductive oxide of the present invention is constructed, it is preferred that the P-V value thereof according to JIS B0610 is set to a value of 1 μm or less.

If such a construction is used as a transparent electrode, a transparent electrode having a color filter or the like, the generation of wire snapping or short circuits can be effectively prevented.

[12] A further embodiment of the present invention is a process for producing a sputtering target containing a hexagonal layered compound represented by $In_2O_3(ZnO)_m$ wherein m is an integer of 2 to 20, the crystal grain size of the hexagonal layered compound being a value of 5 μm or less, comprising the steps (1) to (3) (the process being referred to as a first production process hereinafter):

(1) blending indium oxide powder with zinc oxide powder having an average grain size of 2 μm or less, (2) making a formed body wherein the atomic ratio of In/(In+Zn) is within the range of 0.75 to 0.97, and (3) sintering the formed body at a temperature of 1,400° C. or higher.

When the production process is carried out in this way, it is possible to provide effectively a target which makes it possible to suppress the generation of nodules when a transparent conductive oxide is formed into a film by sputtering, and which makes it possible to perform the sputtering stably.

[13] When the first production process of the sputtering target of the present invention is carried out, it is preferred that in the step (1) 67 to 93% by weight of indium oxide, 5 to 25% by weight of tin oxide and 2 to 8% by weight of zinc oxide are blended, and in the step (2) the formed body wherein the atomic ratio of tin to zinc is 1 or more is formed.

When the production process is carried out in this way, it is possible to provide effectively a target which makes it possible to suppress the generation of nodules when a transparent conductive oxide is formed into a film by sputtering, and which makes it possible to perform the sputtering stably.

[14] A still further embodiment of the present invention is a process for producing a sputtering target containing a hexagonal layered compound represented by $In_2O_3(ZnO)_m$ wherein m is an integer of 2 to 20, the crystal grain size of the hexagonal layered compound being a value of 5 μm or less, comprising the steps (1) to (5) (the process being referred to as a second production process hereinafter):

(1) producing a hexagonal layered compound represented by $In_2O_3(ZnO)_m$ wherein m is an integer of 2 to 20, (2) adjusting the produced hexagonal layered compound to have a grain size of 5 μm or less, (3) blending the hexagonal layered compound having the adjusted grain size with indium oxide powder, (4) making a formed body wherein the atomic ratio of In/(In+Zn) is within the range of 0.75 to 0.97, and (5) sintering the formed body at a temperature of 1,400° C. or higher.

When the production process is carried out in this way, the hexagonal layered compound whose grain size is beforehand controlled can be used. Therefore, the average grain size in the target can be more easily controlled.

[15] When the first and second production process of the sputtering target of the present invention is carried out, it is preferred that the sintering step is performed in the atmosphere of oxygen gas or pressured oxygen gas.

When the production processes are carried out in this way, it is possible to provide effectively a target which makes it possible to suppress the generation of nodules still more, and which makes it possible to perform the sputtering stably.

[16] When the first and second production processes of the present invention are carried out, it is preferred that the average grain size of the indium oxide powder is set to a value within the range of 0.1 to 2 μm.

When the production processes are carried out in this way, it is possible to provide more effectively a target wherein the crystal grain size of the hexagonal layered compound is controlled into the given range.

[17] When the first and second production process of the present invention are carried out, it is preferred that tin oxide powder is further blended together with the indium oxide powder and the average grain size of the tin oxide powder is set to a value within the range of 0.01 to 1 μm.

When the production processes are carried out in this way, it is possible to provide more effectively a target wherein the crystal grain sizes of the hexagonal layered compound and the spinel structural compound are controlled into the given ranges.

[18] When the first and second production processes of the present invention are carried out, it is preferred that when the formed body is formed, a spinel compound whose grain size is adjusted to 5 μm or less is further blended.

When the production processes are carried out in this way, the spinel structural compound whose grain size is beforehand controlled can be used. Therefore, the average grain size in the target can be more easily controlled.

BRIEF DESCRIPTION OF DRAWINGS

FIG. 6 is an X-ray diffraction chart of a target containing a spinel structural compound.

BEST MODE FOR CARRYING OUT THE INVENTION

Figure 1:
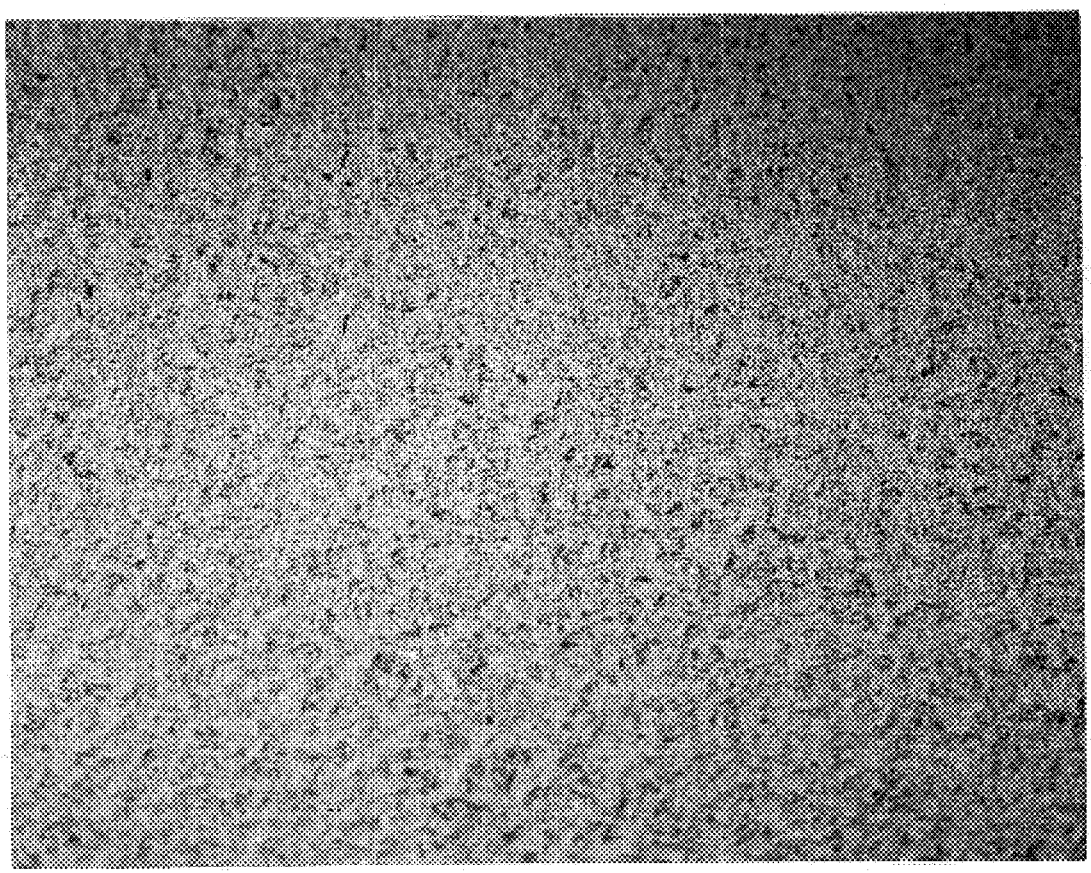
FIG. 1 is a photograph of a surface of a target (after sputtering) in a first embodiment.
Figure 2:
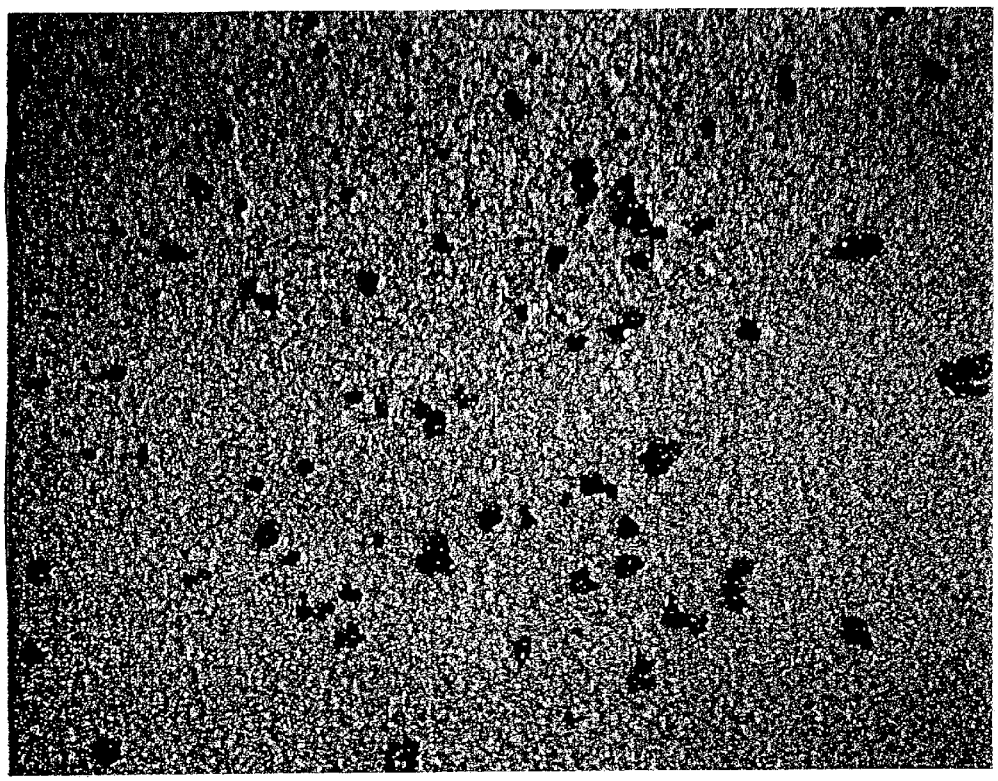
FIG. 2 is a photograph of a surface of a conventional target (after sputtering).

Referring to the drawings, embodiments 1 to 8 according to present inventions (first to sixth inventions) will be specifically described hereinafter.

The drawings for reference merely illustrate the sizes and the shapes of respective constituent elements and the arrangement relationship therebetween schematically to such an extent that the present inventions can be understood. Accordingly, the present inventions are not limited to illustrated examples. In the drawings, hatching for representing sections may be omitted.

First Embodiment

The first embodiment is an embodiment related to the first invention, and is a sputtering target comprising at least indium oxide and zinc oxide, wherein the atomic ratio represented by In/(In+Zn) is set to a value within the range of 0.75 to 0.97, and further, a hexagonal layered compound represented by $In_2O_3(ZnO)_m$ wherein m is an integer of 2 to 20 is contained, and the crystal grain size of the hexagonal layered compound is set to a value of 5 μm or less.

(1) Composition Ratio

In the first embodiment, about the composition of the respective metal oxides which are constituent components of the target, it is necessary to set the atomic ratio represented by In/(In+Zn) to a value within the range of 0.75 to 0.97.

This is because if the atomic ratio represented by In/(In+Zn) is less than 0.75, the conductivity of the transparent conductive oxide obtained by sputtering may drop. On the other hand, if the atomic ratio represented by In/(In+Zn) is over 0.97, the In content becomes large so that nodules are easily generated in the sputtering.

Accordingly, the atomic ratio represented by In/(In+Zn) is more preferably set to a value within the range of 0.80 to 0.95, and still more preferably set to a value within the range of 0.85 to 0.95 since the balance between the conductivity of the resultant transparent conductive oxide and prevention of the generation of nodules becomes better.

(2) Crystal Structure 1

The first embodiment is characterized by containing indium oxide and zinc oxide, out of the target-constituting elements, as a hexagonal layered compound represented by $In_2O_3(ZnO)_m$ wherein m is an integer of 2 to 20.

The reasons why indium oxide and zinc oxide are not caused to be merely present as a mixture but are incorporated in the crystal form (crystal grain size: 5 μm or less) of the hexagonal layered compound are that the target can be made dense or the density of the target can be improved, and that the conductivity of the resultant transparent conductive oxide is improved.

By causing indium oxide and zinc oxide to be contained in the crystal form of the hexagonal layered compound, the crystal growth of indium oxide can be suppressed. As a result, when sputtering is performed, the generation of nodules is prevented to make it possible to make the sputtering stable.

The presence of the hexagonal layered compound represented by $In_2O_3(ZnO)_m$ can be verified by X-ray diffraction analysis of crystal structure. For example, if the X-ray diffraction analysis charts shown in FIGS. 5(a)–(d) and peaks charts thereof are obtained, the presence of the hexagonal layered compound represented by $In_2O_3(ZnO)_m$ can be recognized.

(3) Crystal Structure 2

① Crystal Grain Size

In the first embodiment, it is necessary to set the crystal grain size of the hexagonal layered compound in the target to a value of 5 μm or less.

This is because if this crystal grain size is over 5 μm, nodules are very easily generated when sputtering is performed.

However, if the crystal grain size is excessively small, the control may become difficult or the kinds of the raw materials which can be used may be excessively limited.

Accordingly, the crystal grain size of the hexagonal layered compound in the target is more preferably set to a value within the range of 0.1 to 4 μm, and is still more preferably set to a value within the range of 0.5 to 3 μm.

② Relationship between the size of the crystal grains and the number of generated nodules Referring to FIG. 3, the relationship between the value of the crystal grain size of the hexagonal layered compound and the number of generated nodules will be described in detail herein.

Figure 3:
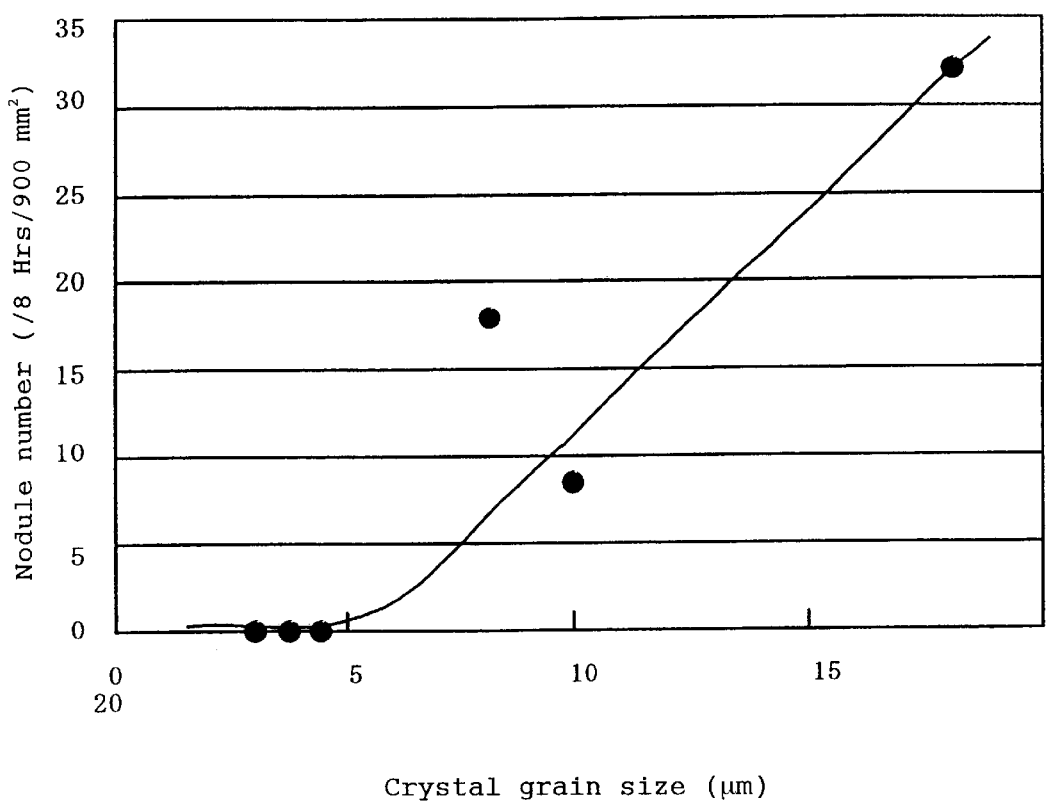
FIG. 3 is a graph showing a relationship between the crystal grain size and the nodule number in the target (after the sputtering) in the first embodiment.

The transverse axis in FIG. 3 represents the size (μm) of crystal grains of the hexagonal layered compound, and the vertical axis in FIG. 3 represents the number of nodules generated per unit area and unit sputtering time (/8 hours/900 mm$^2$).

As can easily be understood from FIG. 3, if the crystal grain size of the hexagonal layered compound is 5 μm or less, the number of the generated nodules is zero/8 hours/900 mm$^2$. On the other hand, if the crystal grain size of the hexagonal layered compound is over 5 μm, the number of the generated nodules increases rapidly and nodules, the number of which is eight to thirty two/8 hours/900 mm$^2$, are generated.

Conversely speaking, it can be understood from FIG. 3 that it is effective to set the crystal grain size of the hexagonal layered compound to 5 μm or less, in order to prevent the generation of the nodules effectively, and the generation of the nodules can surely be prevented by setting the crystal grain size to 4 μm or less.

③ Method of Measuring the Crystal Grain Size

The crystal grain size of the hexagonal layered compound can be measured, using an electron beam microanalyzer (which may be referred to as an EPMA hereinafter).

More specifically, after the surface of the target is polished into a smooth face, a microscope is used to enlarge the target surface by 5,000 times. In this state, a frame of 30 μm×30 μm is set at an arbitrary position, and then the maximum size of crystal grains in the hexagonal layered compound observed inside this frame is measured with the EPMA. At 3 or more positions, the maximum sizes of the crystal grains are measured inside the frame. The average value thereof is calculated. This value can be used as the crystal grain size of the hexagonal layered compound.

This crystal grain size of the hexagonal layered compound can easily be distinguished by mapping (concentration distribution) of zinc with the EMPA, whereby the crystal grain size can be actually measured.

④ Control of the Crystal Grain Size

The crystal grain size of the hexagonal layered compound can be controlled into a given range by changing appropriately the selection of the kind of ingredient powder constituting the target, the average grain size of the ingredient powder, conditions for producing the target, or the like.

For example, about the kind and the average grain size of the ingredient powder, it is advisable that the average grain size of zinc oxide powder used when the target is produced is set to 2 μm or less.

This is because if the average grain size of the zinc oxide powder is over 2 μm, zinc oxide diffuses and moves easily to indium oxide to make it difficult to control the crystal grain size of the formed hexagonal layered compound. Conversely speaking, if the average grain size of the zinc oxide powder is 2 μm or less, indium oxide diffuses and moves easily to zinc oxide so that the value of the crystal grain size of the hexagonal layered compound can be controlled to 5 μm or less.

However, if the average grain size of the zinc oxide powder becomes excessively small, the handling thereof may become difficult. Alternatively, it becomes necessary to conduct mixing and pulverizing treatment strictly, so that costs may rise.

Therefore, the average grain size of the zinc oxide powder is preferably set to a value within the range of 0.1 to 1.8 μm, is more preferably set to a value within the range of 0.3 to 1.5 μm, and is still more preferably set to a value within the range of 0.5 to 1.2 μm.

On the other hand, it is preferred that the average grain size of the indium oxide powder is also made substantially equal to the average grain size of the zinc oxide powder.

Therefore, the average grain size of the indium oxide powder used when the target is produced is preferably set to a value within the range of 0.1 to 1.8 μm, is more preferably set to a value within the range of 0.3 to 1.5 μm, and is still more preferably set to a value within the range of 0.5 to 1.2 μm.

(4) Bulk Resistance

The bulk resistance of the target is preferably set to a value less than $1 \times 10^{-3}$ Ω·cm.

This is because if the bulk resistance is $1 \times 10^{-3}$ Ω·cm or more, abnormal electric discharge is caused during sputtering so that nodules may be generated in the target surface.

However, if the bulk resistance is less than $0.5 \times 10^{-3}$ Ω·cm, the nature of the resultant film may be crystalline.

Therefore, the bulk resistance of the target is more preferably set to a value within the range of $0.5 \times 10^{-3}$ to $0.9 \times 10^{-3}$ Ω·cm, and is still more preferably set to a value within the range of $0.6 \times 10^{-3}$ to $0.8 \times 10^{-3}$ Ω·cm.

(5) Density

The density of the target is preferably set to a value of 6.7 g/cm$^3$ or more.

This is because if this density is a value of less than 6.7 g/cm$^3$, the number of generated nodules may be large.

However, if this density is over 7.1 g/cm$^3$, the target itself becomes metallic so that the stability of sputtering cannot be grained. As a result, a film having superior conductivity and transparency may not be obtained.

Therefore, the density of the target is more preferably set to a value within the range of 6.8 to 7.0 g/cm$^3$.

Second Embodiment

The second embodiment is an embodiment related to the second invention, and is a sputtering target of the first embodiment, which comprises 67 to 93% by weight of indium oxide, and 5 to 25% by weight of tin oxide, and 2 to 8% by weight of zinc oxide, the atomic ratio of tin to zinc being set to a value of 1 or more.

(1) Composition Ratio

① Indium Oxide

The composition of the respective metal oxides which are constituent elements of the target in the second embodiment is characterized in that the indium oxide content by percentage is set to a value within the range of 67 to 93% by weight.

This is because if the indium oxide content is less than 67% by weight, crystallization by heat treatment becomes difficult so that the conductivity of the resultant transparent conductive oxide may drop. On the other hand, if the indium oxide content is over 93% by weight, crystallization is conversely liable to advance so that the nature of the film immediately after sputtering may become crystalline.

Therefore, the indium oxide content is more preferably set to a value within the range of 80 to 93% by weight, and is still more preferably set to a value within the range of 74 to 93% by weight since the balance between the conductivity of transparent conductive oxide and the crystallinity thereof becomes better.

② Tin Oxide

The tin oxide content by percentage in the target is set to a value within the range of 5 to 25% by weight.

This is because if the tin oxide content is less than 5% by weight, the conductivity is not improved even if the crystallization is advanced by heat treatment. Conversely, the conductivity of the resultant transparent conductive oxide may drop.

On the other hand, if the tin oxide content is over 25% by weight, the transparent conductive film does not crystallize even by heat treatment so that the conductivity may drop and nodules may easily be generated.

Therefore, the tin oxide content is more preferably set to a value within the range of 5 to 20% by weight, and is still more preferably set to a value within the range of 7 to 15% by weight since the balance between the crystallinity of the transparent conductive oxide and the conductivity plus the prevention of generation of the nodules becomes better.

③ Zinc Oxide

The zinc oxide content by percentage in the target is set to a value within the range of 2 to 8% by weight.

This is because if the zinc oxide content is less than 2% by weight, the transparent conductive oxide obtained in sputtering crystallizes easily. Alternatively, the crystal grain size of the target becomes larger so that nodules may easily be generated during sputtering.

On the other hand, if the tin oxide content is over 8% by weight, the transparent conductive oxide may not crystallize even by heat treatment so that the conductivity of the transparent conductive oxide may not be improved. If the tin oxide content is over 8% by weight, the bulk resistance of the target may excess $1 \times 10^{-3}$ Ω·cm so that stable sputtering may not be attained.

Therefore, the zinc oxide content is more preferably set to a value within the range of 2 to 6% by weight, and is still more preferably set to a value within the range of 3 to 5% by weight since the balance between the conductivity of the resultant transparent conductive oxide plus the bulk resistance of the target and the prevention of generation of the nodules becomes better.

④ Tin/Zinc

Preferably, the atomic ratio of tin to all the metal atoms is substantially equal to or more than the atomic ratio of zinc to all the metal atoms. Specifically, the atomic ratio of tin to zinc is preferably set to a value of 1 or more.

This is because if the atomic ratio of tin to zinc is a value of less than 1, the diffusion and movement of tin is reduced even by heat treatment so that the so-called doping effect becomes small. As a result, the conductivity of the resultant transparent conductive oxide may drop.

However, if this atomic ratio of tin to zinc is excessively large, unreacted tin remains as an ionic impurity so that the conductivity may drop by the so-called ionic impurity scattering.

Therefore, the atomic ratio of tin to zinc is preferably set to a value within the range of 2 to 10, and is still more preferably set to a value within the range of 3 to 5.

⑤ Ratio Between percentages by Weight of Tin Atoms and Zinc Atoms

The value of the percentage by weight of tin atoms to all the metal atoms (Sn/(In+Sn+Zn)×100) is preferably at least 3% larger than the value of the percentage by weight of zinc atoms to all the metal atoms (Zn/(In+Sn+Zn)×100)).

This is because if the difference between these percentages (%) by weight is made larger than 3%, the doping effect of tin based on heat treatment can be effectively derived. Therefore, the conductivity of the resultant transparent conductive oxide can be effectively improved.

However, if the difference between these percentages (%) by weight is excessively larger, the conductivity may drop by the above-mentioned ionic impurity scattering.

Therefore, the ratio between the percentages by weight of tin atoms and zinc atoms is more preferably set to a value within the range of 4 to 30%, and is still more preferably set to a value within the range of 5 to 20%.

(2) Crystal Structure 1

In the target of the second embodiment, indium oxide and zinc oxide are preferably contained as a hexagonal layered compound represented by the general formula: $In_2O_3(ZnO)_m$ wherein m is an integer of 2 to 20 in the same way as in the first embodiment.

(3) Crystal Structure 2

① Spinel Structural Compound

The crystal structure of the second embodiment is characterized in that in the target a spinel structural compound represented by $Zn_2SnO_4$ is contained instead of the hexagonal layered compound or together with the hexagonal layered compound, and the crystal grain size of the spinel structural compound is set to a value of 5 μm or less.

This is because the density of the target can be made high and the conductivity thereof can be improved by causing tin oxide and zinc oxide to be present in the form of the crystal of the spinel structural compound represented by $Zn_2SnO_4$. Accordingly, by using such a target, a further improvement can be made in stability when sputtering is performed.

By incorporating these hexagonal layered compound and spinel structural compound, the growth of the crystal of indium oxide is suppressed so that the whole of the sputtering target becomes fine and dense crystal texture. Thus, the conductivity of the resultant transparent conductive oxide can also be improved.

② X-ray Diffraction Analysis

The presence of the spinel structural compound represented by $Zn_2SnO_4$ can be verified by X-ray diffraction analysis of crystal structure.

For example, if the X-ray diffraction analysis charts shown in FIGS. 6(a)–(d) and peaks charts thereof are obtained, the presence of the spinel structural compound represented by $Zn_2SnO_4$ can be recognized.

③ Crystal Grain Size

The crystal grain size of the spinel structural compound is preferably set to a value of 5 μm or less. This is because if this crystal grain size is over 5 μm, nodules are remarkably liable to be generated in sputtering.

However, if this crystal grain size becomes excessively small, the control may become difficult or the kinds of the raw materials which can be used may be excessively limited.

Accordingly, the crystal grain size of the spinel structural compound in the target is more preferably set to a value within the range of 0.1 to 4 μm, and is still more preferably set to a value within the range of 0.5 to 3 μm.

As described in the first embodiment, the crystal grain size of the spinel structural compound can easily be distinguished by mapping (concentration distribution) of zinc with the EPMA in the same manner as about the hexagonal layered compound, whereby the crystal grain size can be actually measured.

④ Relationship Between the Value of the Crystal Grain Size and the Number of Generated Nodules Referring to FIG. 4, the relationship between the value of the crystal grain size of the spinel structural compound and the hexagonal layered compound and the number of generated nodules will be described in more detail herein.

Figure 4:
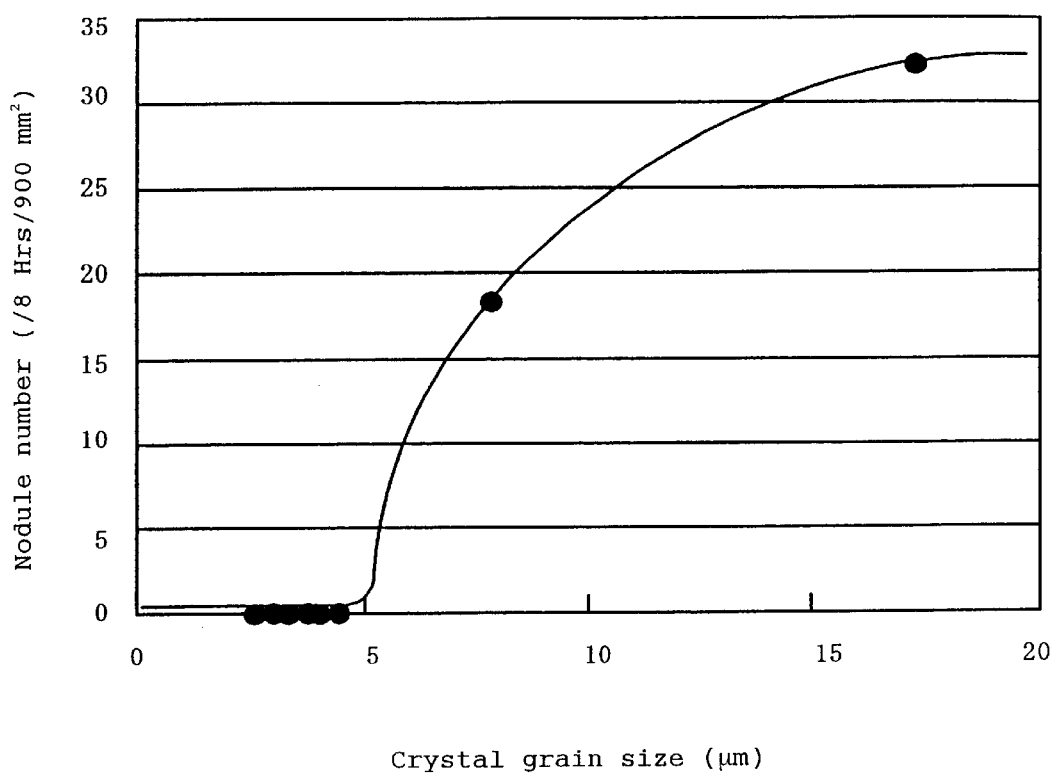
FIG. 4 is a graph showing a relationship between the crystal grain size and the nodule number in a target (after sputtering) in a second embodiment.
Figure 5A:
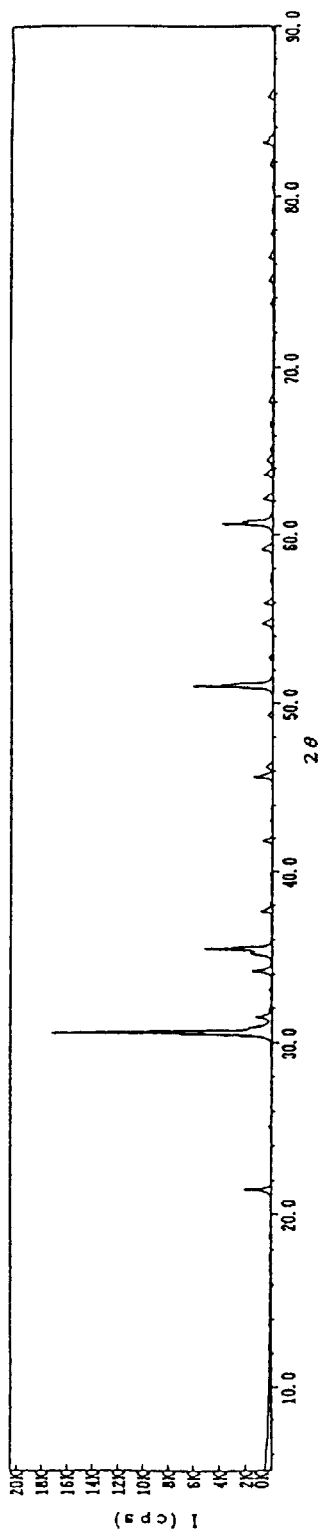
FIG. 5 is an X-ray diffraction chart of a target containing a hexagonal layered compound.
Figure 5B:
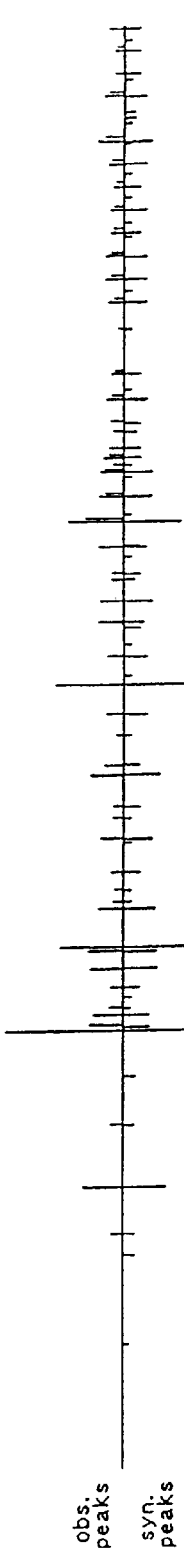
Figure 5C:
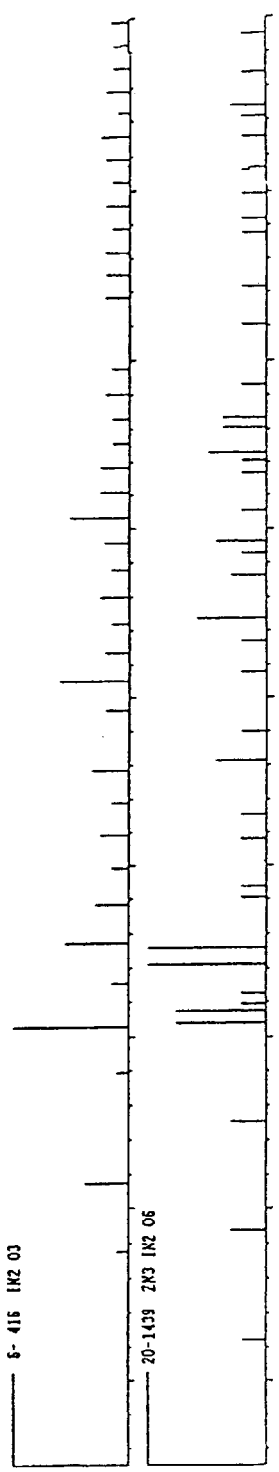
Figure 5D:

The transverse axis in FIG. 4 represents the value ($\mu$m) of crystal grain size in the state that the spinel structural compound and the hexagonal layered compound coexist, and the vertical axis therein represents the number of nodules generated per unit area and unit sputtering time (/8 hours/900 mm$^2$).

As can easily be understood from FIG. 4, if the crystal grain size of the spinel structural compound and the hexagonal layered compound is 5 $\mu$m or less, the number of the generated nodules is 0/8 hours/900 mm$^2$. On the other hand, if the crystal grain size of the spinel structural compound and the hexagonal layered compound is over 5 $\mu$m, the number of the generated nodules increases rapidly and nodules, the number of which is 5 to 32/8 hours/900 mm$^2$, are generated.

Conversely speaking, it can be understood from FIG. 4 that it is effective to set the crystal grain size of the spinel structural compound and the hexagonal layered compound to 5 $\mu$m or less, in order to prevent the generation of the nodules effectively, and the generation of the nodules can surely be prevented by setting the crystal grain size to 4 $\mu$m or less.

⑤ Control of the Crystal Grain Size

The crystal grain size of the spinel structural compound can be controlled into a given range by changing appropriately the selection of the kind of ingredient powder constituting the target, the average grain size of the ingredient powder, conditions for producing the target, or the like.

For example, about the kind and the average grain size of the ingredient powder, it is preferred to set the average grain size of zinc oxide powder used when the target is produced to 2 $\mu$m or less, set the average grain size of tin oxide powder to a value within the range of 0.01 to 1 $\mu$m, and make the average grain size of the tin oxide powder smaller than that of the zinc oxide powder.

This is because if each of the average grain sizes of the zinc oxide powder and the tin oxide powder is limited into such a range, diffusion and movement thereof can be controlled so that the crystal grain sizes of the hexagonal layered compound and the spinel structural compound in the target can easily be controlled (5 $\mu$m or less).

Therefore, the average grain size of the tin oxide powder is more preferably set to a value within the range of 0.02 to 0.5 $\mu$m, is still more preferably set to a value within the range of 0.03 to 0.3 $\mu$m, and is most preferably set to a value within the range of 0.05 to 0.2 $\mu$m. A desired target can be obtained by producing the hexagonal layered compound and the spinel structural compound beforehand, making the compounds into desired grain sizes, and mixing them with the indium oxide powder.

(4) Bulk Resistance and Density

In the second embodiment, the bulk resistance of the target is preferably set to a value less than 1×10$^{-3}$ $\Omega$·cm and the density of the target is preferably set to a value of 6.7 g/cm$^3$ or more in the same manner as in the first embodiment.

Third Embodiment

The third embodiment is an embodiment related to the third invention, and is a transparent conductive oxide obtained using a sputtering target wherein the atomic ratio represented by In/(In+Zn) is set to a value within the range of 0.75 to 0.97, and further, a hexagonal layered compound represented by In$_2$O$_3$(ZnO)$_m$ wherein m is an integer of 2 to 20 is contained, and the crystal grain size of the hexagonal layered compound is set to a value of 5 $\mu$m or less.

(1) Target

In the third embodiment, the used target is the same as in the first embodiment. Therefore, the target is a target wherein the atomic ratio represented by In/(In+Zn) is within the range of 0.75 to 0.97, more preferably a target wherein the atomic ratio represented by In/(In+Zn) is within the range of 0.80 to 0.95, and still more preferably a target wherein the atomic ratio represented by In/(In+Zn) is within the range of 0.85 to 0.95.

(2) Film Thickness

The film thickness of the transparent conductive oxide can be appropriately selected dependently on use purpose, the material of the substrate on which the transparent conductive oxide is deposited, and so on. In general, the film thickness preferably ranges from 3 to 3,000 nm.

The reasons for this are as follows. If this film thickness is less than 3 nm, the conductivity of the transparent conductive oxide is liable to be insufficient. On the other hand, if the film thickness is over 3,000 nm, the light transmittance thereof may drop or cracks or the like may easily be generated in the transparent conductive oxide when the transparent conductive oxide is deformed in or after the step of producing the transparent conductive oxide.

Therefore, the film thickness of the transparent conductive oxide is preferably set to a value within the range of 5 to 1,000 nm, and is more preferably set to a value within the range of 10 to 800 nm.

Figure 7:
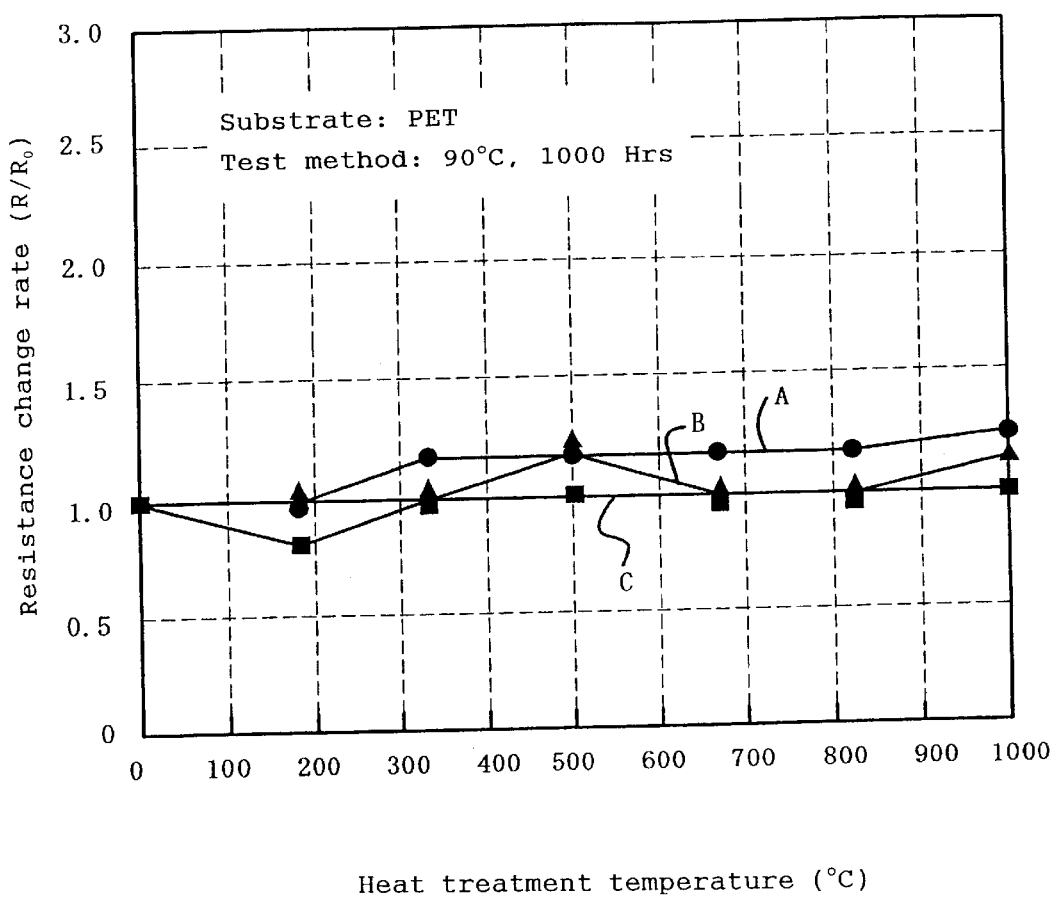
FIG. 7 is a graph showing the resistance stability ratios of transparent conductive oxides.
Figure 8:
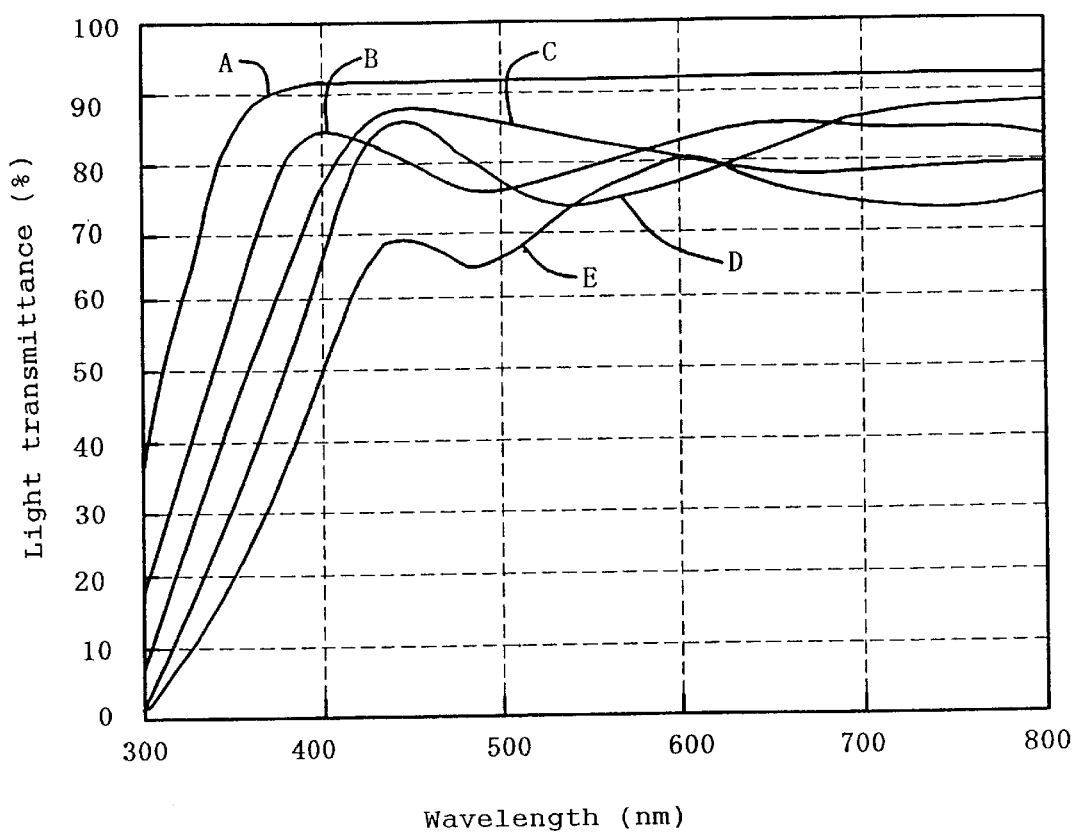
FIG. 8 is a graph showing light transmittance curves of transparent conductive oxides.

FIGS. 7 and 8 show effects of the film thickness on the resistance change rate and the light transmittance curve of the transparent conductive oxide, respectively.

It is understood from FIG. 7 that even if the film thickness of the transparent conductive oxide (substrate: PET) is changed to 68 nm (curve A), 100 nm (curve B) and 200 nm (curve C), respectively, the resistance change rates thereof hardly have difference in a 1000-hour heating test at 90° C.

According to FIG. 8, in the case that the film thickness of IZO was changed to 100 nm (curve B), 220 nm (curve C), and 310 nm (curve D), respectively, a tendency that the light transmittance at the respective wavelengths dropped slightly if the film thickness was made larger was found out.

(3) Substrate

When the target is used to form the transparent conductive oxide into a film, the film is preferably formed on a substrate.

Such a substrate is preferably a glass substrate or a film or sheet substrate made of a transparent resin.

More specific examples of the glass substrate include glass plates made of soda lime, lead glass, borosilicate glass, high-purity silica glass, non-alkali glass and so on.

Of these glass plates, the non-alkali glass plate is more preferred since no alkali ions diffuse into the transparent conductive oxide.

The transparent resin is preferably a resin having a sufficiently high light transmittance and a superior electric insulation. Specific examples thereof include polyester resins such as polyethylene terephthalate resin, polycarbonate resin, polyarylate resin, polyether sulfone resin, acrylic resin, polyimide resin, polyamide resin, and maleimide resin.

Of these resins, polycarbonate resin, polyarylate resin, polyethylene terephthalate resin, or polyether sulfone resin is suitably used since these resins also have heat resistance.

(4) Heat Treatment

In the transparent conductive oxide of the third embodiment, the conductivity thereof can be made high by heat treatment (including crystallizing treatment) after the formation into the film.

About conditions for such heat treatment, treatment time is preferably set to a value within the range of 0.5 to 3 hours in the temperature range of 180 to 300° C., preferably in the temperature range of 200 to 250° C.

It has been proved that if such heat treatment conditions are used, the resistivity of the transparent conductive oxide immediately after the formation into the film can be made low, for example, in a rate of 20 to 80%.

(5) Resistivity

The resistivity of the transparent conductive oxide is preferably set to a value of 800 $\mu\Omega$·cm or less.

If this resistivity exceeds 800 $\mu\Omega$·cm, uses which can be applied may be excessively limited.

Therefore, the resistivity of the transparent conductive oxide is more preferably set to a value of 600 $\mu\Omega$·cm or less, and is still more preferably set to a value of 300 $\mu\Omega$·cm or less.

(6) Light Transmittance

As shown by the curve B (IZO/7059 glass) in FIG. 8, the light transmittance (at a wavelength of 500 nm or 550 nm) of the transparent conductive oxide is preferably a value of 75% or more, more preferably a value of 80% or more in the case that the thickness thereof is, for example, 100 nm.

If the transparent conductive oxide has such a light transmittance, the transparent conductive oxide can be suitably used as transparent electrodes of various display devices such as liquid crystal display elements and electroluminescence display elements, for which high transparency and conductivity are required.

The curve A in FIG. 8 is the transmittance curve of the glass substrate (7059 glass); the curve C is an example wherein an IZO film of the third embodiment, which had a thickness of 220 nm, was formed on the glass substrate; the curve D is an example wherein an IZO film of the third embodiment, which had a thickness of 310 nm, was formed on the glass substrate; and the curve E is an example wherein an ITO film, which had a thickness of 220 nm, was formed on the glass substrate.

(7) Refractive Index

Figure 9:
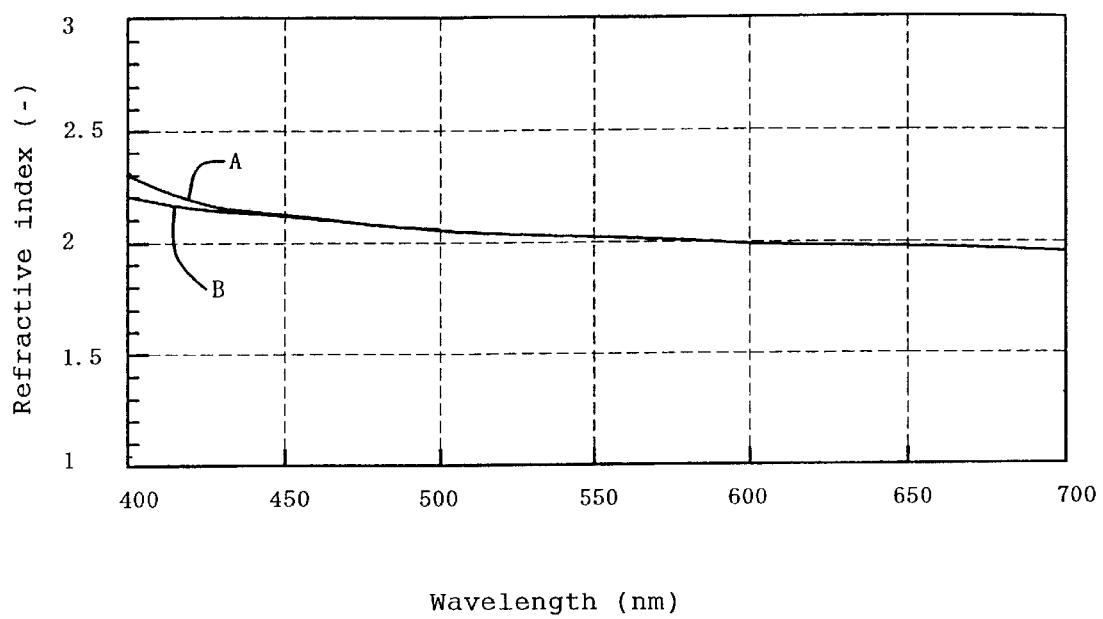
FIG. 9 is a graph showing refractive index curves of transparent conductive oxides.

As shown by the curve B (IZO/7059 glass) in FIG. 9, the refractive index (at a wavelength of 500 nm) of the transparent conductive oxide is preferably a value of 2.5 or less in the case that the thickness thereof is, for example, 90 nm.

If the transparent conductive oxide has such a low refractive index, the transparent conductive oxide can be suitably used as transparent electrodes of various display devices such as liquid crystal display elements and electroluminescence display elements, for which high transparency and anti-reflectivity are required.

The curve A in FIG. 9 is an example wherein an IZO film of the third embodiment, which had a thickness of 30 nm, was formed on a glass substrate (7059 glass).

(8) Surface Roughness (P-V Value) The P-V value (according to JIS B0601) of the transparent conductive oxide, as an index for the surface roughness thereof, is preferably set to a value of 1 $\mu$m or less.

If the transparent conductive oxide has such a P-V value, the generation of wire-snapping or short circuits can be effectively prevented even if the transparent conductive oxide is used as transparent electrodes of various display devices such as liquid crystal display elements and electroluminescence display elements.

In the case that the surface roughness of the transparent conductive oxide is represented by other indexes, Ra (according to JIS B0601) thereof is preferably set to a value of 100 nm or less and Rz (JIS B0601) thereof is preferably set to a value of 500 nm or less.

(9) Method of Forming a Film

When the transparent conductive oxide is formed into a film on a substrate, the following can be used: a magnetron sputtering machine, an electron beam machine, an ion plating machine, a laser ablation machine or the like. More preferably, a magnetron sputtering machine is used.

About conditions for forming the film using, for example, such a magnetron sputtering machine, plasma output varies to some extent dependently on the area of the target or the film thickness of the transparent conductive oxide. However, it is in general preferred to set the plasma output to a value within the range of 0.3 to 4 W per $cm^2$ of the target area and set film-forming time to a value of 5 to 120 minutes.

Such film-forming conditions make it possible to obtain the transparent conductive oxide having a desired film thickness easily.

(10) Uses

Examples of preferred uses of the third embodiment include a transparent electrode of a liquid crystal display element, a transparent electrode of an electroluminescence element, a transparent electrode of a solar cell, a parent material when these transparent electrodes are formed by etching, an antistatic film, and an anti-icing heater for window glass.

Fourth Embodiment

The fourth embodiment is an embodiment related to the fourth invention, and is a transparent conductive oxide obtained using a sputtering target of the third embodiment, which comprises 67 to 93% by weight of indium oxide, and 5 to 25% by weight of tin oxide, and 2 to 8% by weight of zinc oxide, the atomic ratio of tin to zinc being set to a value of 1 or more.

(1) Target

As the target used in the fourth embodiment, the same target as in the second embodiment can be used.

That is, the target is a target comprising 67 to 93% by weight of indium oxide, 5 to 25% by weight of tin oxide, and 2 to 8% by weight of zinc oxide.

As the composition of the target, more preferred is a composition comprising 74 to 93% by weight of indium oxide, 5 to 20% by weight of tin oxide, and 2 to 6% by weight of zinc oxide. Still more preferred is a composition comprising 80 to 89% by weight of indium oxide, 8 to 15% by weight of tin oxide, and 3 to 5% by weight of zinc oxide.

In the target used in the fourth embodiment, the value of the atomic ratio of tin atoms in tin oxide, which is a constituent component of this transparent conductive oxide, to all the metal atoms is equal to or more than the atomic ratio of zinc atoms in zinc oxide to all the metal atoms in the same manner as in the second embodiment. In short, the atomic ratio of tin to zinc is preferably set to a value of 1 or more.

In the target used in the fourth embodiment, it is more preferred to use an oxide target having a form in which indium oxide and zinc oxide make a hexagonal layered compound represented by $In_2O_3(ZnO)_m$ wherein m is 2 to 20 and the hexagonal layered compound is locally positioned in crystal of indium oxide.

The value of m in the formula representing this hexagonal layered compound is 2 to 20, preferably 2 to 8, and more preferably 2 to 6.

The purity of the target used in the fourth embodiment is preferably 98% or more.

If this purity is less than 98%, the chemical stability, conductivity or light transmittance of the resultant film may deteriorate by the presence of impurities.

Therefore, the purity is more preferably 99% or more, and is still more preferably 99.9% or more.

In the case of using a sintered target, the relative density (theoretical density) of this target is preferably set to 96% or more. If this relative density is less than 96%, a drop in film-forming speed or film quality is easily caused.

Therefore, the relative density of the sintered target is more preferably 97% or more, still more preferably 98% or more.

The relative density (theoretical density) of the target is the sum value calculated from the densities of the respective raw materials and the respective added amounts (% by weight) thereof.

(2) Crystallizing Treatment

About the transparent conductive oxide of the fourth embodiment, it is preferred to use the above-mentioned target to make the transparent conductive oxide into an amorphous film by sputtering, and subsequently crystallize the film at 230° C. or higher.

The reason why the amorphous transparent conductive oxide is formed in this way when the film is made by sputtering is that the etching property of the amorphous transparent conductive oxide is better than that of crystalline transparent conductive oxide even if the compositions of metal oxides constituting the transparent conductive oxides are the same.

Next, the amorphous transparent conductive oxide is crystallized into a transparent conductive oxide. Such a transparent conductive oxide has a highly improved conductivity. Such a transparent conductive oxide has stability in electric resistance at high temperature or at high moisture, as shown in FIG. 7.

Heat treatment temperature when the amorphous transparent conductive oxide is crystallized is more preferably a value of 250° C. or higher, still more preferably a value of 280° C. or higher.

As this heat treatment temperature is higher, a more favorable effect is produced since crystallizing speed is faster. However, the heat treatment temperature is preferably set to a temperature which does not cause thermal deformation of the transparent substrate. Therefore, for example, in the case that a resin is used as the substrate, the heat treatment temperature is preferably set to a temperature of 250° C. or lower. In the case that a glass substrate is used, this temperature is preferably set to a temperature of 500° C. or lower. The crystal type obtained by the heat treatment is preferably made to bixbite type crystal of only indium oxide in light of the heat treatment temperature. This is because if the other hexagonal layered compounds or spinel structural compounds are contained, the conductivity may drop by the so-called ionic impurity scattering.

Figure 10:
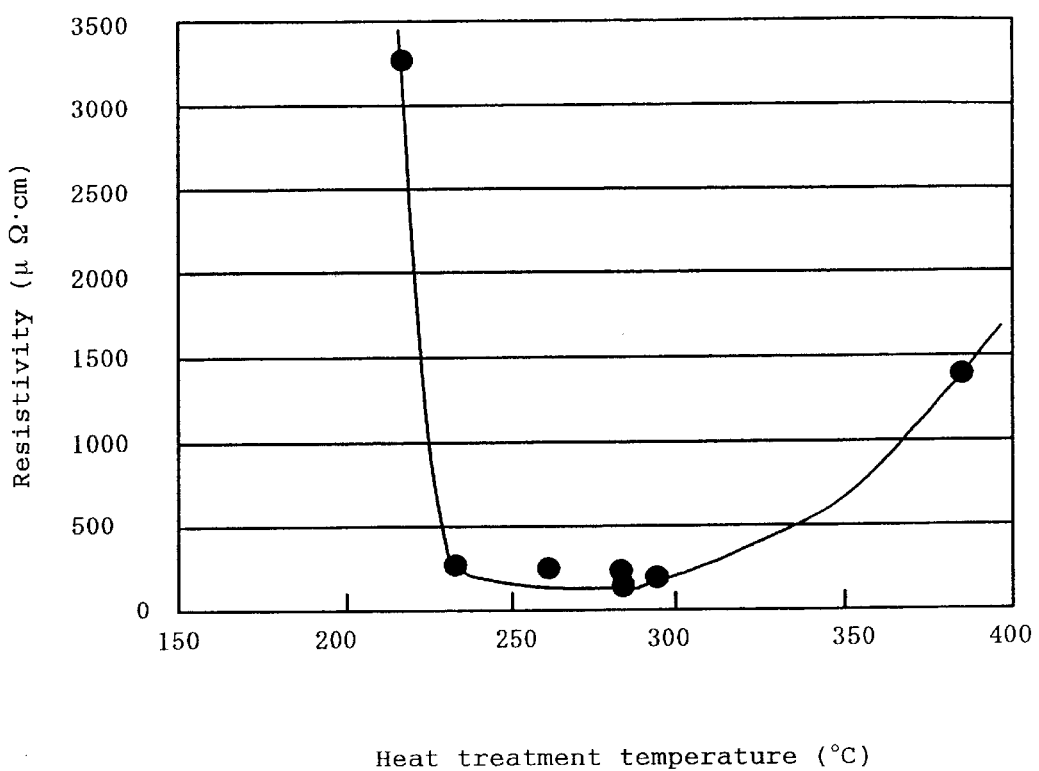
FIG. 10 is a graph showing an effect of heat treatment temperature when a transparent conductive oxide is produced.

Referring to FIG. 10, the effect of the crystallizing temperature will be described in more detail.

The transverse axis in FIG. 10 represents heat treatment temperature (° C.) as the crystallizing temperature, and the vertical axis therein represents resistivity ($\mu\Omega$·cm).

As can easily be understood from FIG. 10, if the heat treatment temperature is less than 230° C., the value of the resistivity becomes very high, that is, 3,200 $\mu\Omega$·cm. Conversely, if the heat treatment temperature is over 350° C., the value of the resistivity becomes high, that is, 1,000 $\mu\Omega$·cm.

Conversely speaking, in order to make effectively the value of the resistivity low, for example, into a value of 500 $\mu\Omega$·cm or less, the heat treatment temperature is preferably set to a value within the range of 230 to 320° C., is more preferably set to a value within the range of 240 to 300° C., and is still more preferably set to a value within the range of 250 to 290° C. according to FIG. 10.

(3) Etching Treatment

The transparent conductive oxide of the fourth embodiment is preferably etched to have a given shape.

That is, the amorphous transparent conductive oxide made into a film by sputtering can easily be etched with, for example, an aqueous solution having a concentration of 5% by weight of oxalic acid.

By making the temperature of the etching treatment high, etching property can be improved. For example, in the case that etching is performed at 40 to 50° C., the etching speed can be made to a value of 0.1 $\mu$m/minute or more.

Accordingly, this amorphous transparent conductive oxide is characterized by being easily etched without using a strong acid such as hydrochloric acid or aqua regia as an etching solution or requiring complicated operations such as attachment of a protective film onto a wiring electrode as performed for conventional ITO films.

It is particularly preferred to use, as the etching solution, an aqueous solution having a concentration of 3 to 10% by weight of oxalic acid. If the concentration of oxalic acid in this aqueous solution is thinner than 3% by weight, sufficient etching speed may be obtained. On the other hand, if this concentration is over 10% by weight, crystal may be generated in the solution.

It is also preferred to set the temperature of the etching solution to a value within the range of 30 to 90° C. This is because if the temperature of the etching solution is less than 30° C., the etching speed may excessively drop and if the temperature of the etching solution is over 90° C., the management of the etching solution may become difficult.

Therefore, the temperature of the etching solution is more preferably set to a value within the range of 35 to 70° C., and is still more preferably set to a value within the range of 40 to 50° C.

(4) Film Thickness

The form of the transparent conductive oxide is not particularly limited. For example, a film form is preferred.

In this case, the film thickness can be appropriately selected dependently on the use thereof, the material of the substrate on which the transparent conductive oxide is deposited, and soon. The film thickness preferably ranges from 3 to 3,000 nm in the same manner as in the third embodiment.

(5) Multilayered Composite

It is preferred to fit, to the transparent conductive oxide, a gas barrier layer, a hard coat layer, an antireflection layer, and the like on the substrate face opposite to the face on which the transparent conductive oxide is deposited, thereby making a multilayered composite.

As the material for forming such a gas barrier layer, there is used ethylene-vinyl alcohol copolymer, polyvinyl alcohol, polyacrylonitrile, polyvinylidene chloride, polyvinylidene fluoride or the like.

As the material for forming the hard coat layer, there is used a titanium- or silica-based hard coat agent, a polymer material such as polymethyl methacrylate, or an inorganic polymer material such as polyphosphazene. As the material for forming the antireflection layer, there is used a low-refractive index polymer, a fluoride such as $MgF_2$ or $CaF_2$, or an oxide such as $SiO_2$, ZnO, $BiO_2$ or $Al_2O_3$.

In the transparent conductive oxide of the present invention, an organic polymer thin film or an inorganic thin film may be formed on a surface thereof.

(6) Method of Forming a Film
① Film-forming Device

Next, the transparent conductive oxide of the present invention may be produced by any one of various methods, such as sputtering, ion plating, vapor deposition, and laser ablation.

From the viewpoint of the performance of the transparent conductive oxide, the productivity thereof, and so on, the use of sputtering is more preferred.

The sputtering may be ordinary sputtering (referred to as direct sputtering), such as RF magnetron sputtering or DC magnetron sputtering; or reactive sputtering. That is, the composition of the used sputtering target or sputtering conditions may be appropriately selected dependently on the composition of the transparent conductive oxide.

② Film-forming Conditions 1

Sputtering conditions when the transparent conductive oxide is deposited on the transparent substrate by direct sputtering vary dependently on the method of the direct sputtering, the composition of the sputtering target, the property of the used machine, and so on. It is therefore difficult to specify the conditions without reservation. However, in the case of DC magnetron sputtering, an example of the conditions is preferably set as follows.

(Vacuum Degree)

About the attainment vacuum degree in direct sputtering, it is preferred to reduce the pressure inside a vacuum tank beforehand into a value of $1\times10^{-3}$ Pa or less before the sputtering.

The vacuum degree in the sputtering is preferably set to a value within the range of $1.3\times10^{-2}$ to 6.7 Pa.

The reasons for this are as follows. If the vacuum degree in the sputtering is higher than $1.3\times10^{-2}$ Pa, stability of plasma may deteriorate. On the other hand, if this vacuum degree is lower than 6.7 Pa, it may be difficult to raise the voltage applied to the target.

Therefore, the vacuum degree in the sputtering is more preferably set into the range of $2.7\times10^{-2}$ to 1.3 Pa, and is still more preferably set into the range of $4.0\times10^{-2}$ to $6.7\times10^{-1}$ Pa.

(Applied Voltage)

The voltage applied to the target in the sputtering is preferably set to a value within the range of 200 to 500 V.

The reasons for this are as follows. If this applied voltage is less than 200 V, it may become difficult to obtain a good quality thin film or the speed of the film-formation may be restricted. On the other hand, if this applied voltage is over 500 V, abnormal electric discharge may be caused.

Therefore, the voltage applied to the target in the sputtering is more preferably set to a value within the range of 230 to 450 V, and is still more preferably set to a value within the range of 250 to 420 V.

(Sputtering Gas)

As the sputtering gas (atmospheric gas) in the sputtering, a mixed gas of an inert gas, such as argon gas, and oxygen gas is preferred. Therefore, in the case that argon gas is used as the inert gas, the blend ratio (volume ratio) of argon gas to oxygen gas is preferably set to 0.6:0.4 to 0.999:0.001.

That is, the partial pressure of oxygen is preferably set to a value within the range of $1\times10^{-4}$ to $6.7\times10^{-1}$ Pa, is more preferably set to a value within the range of $3\times10^{-4}$ to $1\times10^{-1}$ Pa, and is still more preferably set to a value within the range of $4\times10^{-4}$ to $7\times10^{-2}$ Pa.

Outside the range of this blend ratio and this partial pressure of oxygen, the resultant transparent conductive oxide may neither have a low resistance nor a high light transmittance.

③ Film-forming Conditions 2

In the method of depositing the transparent conductive oxide on the transparent substrate by reactive sputtering, a target made of an alloy of indium, tin and zinc is used as the sputtering target.

This alloy target may be obtained, for example, by dispersing powder or chips of tin and zinc into melted indium, and then cooling this dispersant.

The purity of this alloy target is preferably 98% or more, more preferably 99% or more, and still more preferably 99.9% or more in the same manner as about the target for direct sputtering.

Conditions for the reactive sputtering vary dependently on the composition of the sputtering target, the property of the machine used, and so on. However, the vacuum degree and voltage applied to the target in the sputtering, and substrate temperature are preferably made equivalent to the conditions for DC direct sputtering.

As the atmospheric gas, a mixed gas of an inert gas, such as argon, and oxygen gas is preferred. The percentage of oxygen gas is preferably set to a value higher than that in direct sputtering.

In the case that argon gas is used as the inert gas, the blend ratio (volume ratio) of argon gas to oxygen gas is preferably set to 0.5:0.5 to 0.99:0.01.

(7) Uses

Since the transparent conductive oxide of the fourth embodiment has the above-mentioned properties, the transparent conductive oxide is suitable for a transparent electrode of a liquid crystal display element, a transparent electrode of an electroluminescence element, a transparent electrode of a solar cell, a parent material when these transparent electrodes are formed by etching, an antistatic film, an anti-icing heater for window glass, or the like.

Fifth Embodiment

The fifth embodiment is an embodiment related to the fifth invention, and is a transparent conductive oxide of the third or fourth embodiment, wherein the half band width of a binding energy peak of the oxygen 1S orbit, which is measured by X-ray photoelectron spectroscopy (XPS), is set to 3 eV or less.

(1) Half Band Width of a Binding Energy Peak of the oxygen 1S Orbit

The transparent conductive oxide of the fifth embodiment can be obtained by using the target of the first to the second embodiments and forming a film by sputtering.

The half band width of a binding energy peak of the oxygen 1S orbit in the surface of the transparent conductive oxide, which is measured by X-ray photoelectron spectroscopy (XPS), is preferably set to 3 eV or less.

This is because if this half band width is over 3 eV, initial connection resistivity may become large or connection resistance during long-term use may increase markedly.

However, if this half band width is 1 eV or less, the range for selecting raw materials which can be used may be excessively limited or the control of the half band width may be difficult.

Therefore, this half band width is more preferably set to a value within the range of 1 to 2.9 eV, and is still more preferably set to a value within the range of 2.0 to 2.8 eV.

The reason why the half band width of the binding energy peak of the oxygen 1S orbit is limited into the given range in this way is based on the following finding.

Figure 13:
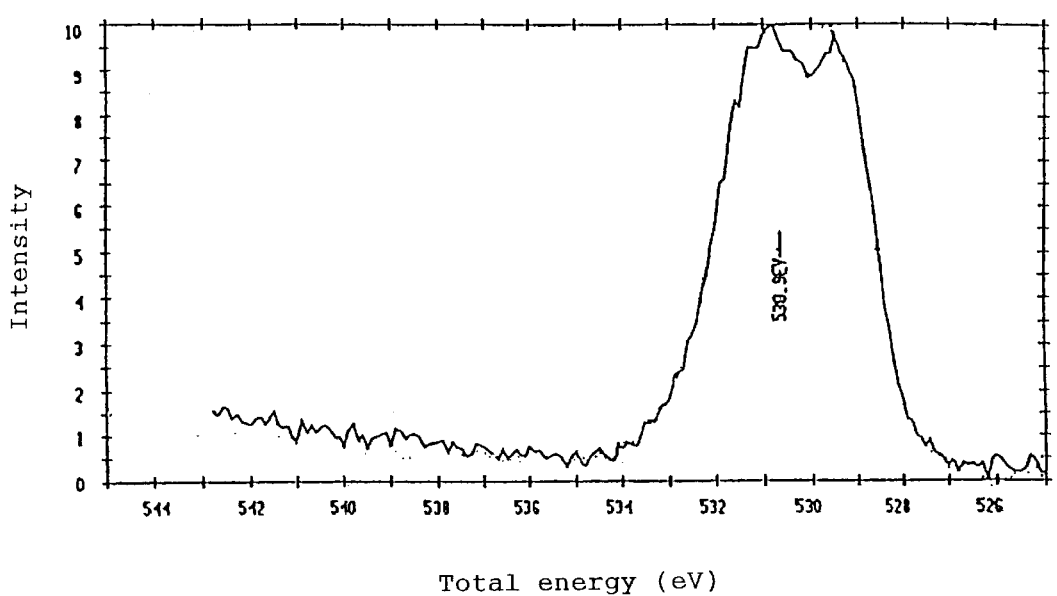
FIG. 13 is a diagram showing a binding energy peak of the 1S orbit of oxygen in a transparent conductive oxide (No. 2).

That is, when the surface state of the transparent conductive oxide formed into a film by sputtering is measured by X-ray photoelectron spectroscopy (XPS), two peaks make their appearance, one thereof being a peak originating from its metal oxide, and the other thereof being a peak originating from its element other than the metal-oxygen-the metal, for example, hydrogen or carbon bonds as shown in FIG. 13. In the case that the transparent conductive oxide wherein the peak originating from the bonds of the element other than the metal-oxygen-the metal, that is, the binding energy peak of the oxygen 1S orbit is relatively large is connected to an external electric circuit such as a liquid crystal driving circuit, the connection resistance thereof may increase or during long-term use thereof the connection resistance may increase.

Thus, in the fifth embodiment, the half band width of the binding energy peak of the oxygen 1S orbit in the surface of the transparent conductive oxide, which is measured by X-ray photoelectron spectroscopy (XPS), is set to the given value. In this way, the initial connection resistance is reduced and further the tendency of a gradual increase in the connection resistance in long-term use is suppressed.

(2) Measurement Method

The half band width of the binding energy peak of the oxygen 1S orbit in the surface of the transparent conductive oxide can be calculated from the oxygen 1S orbit peak and the base line thereof.

Figure 12:
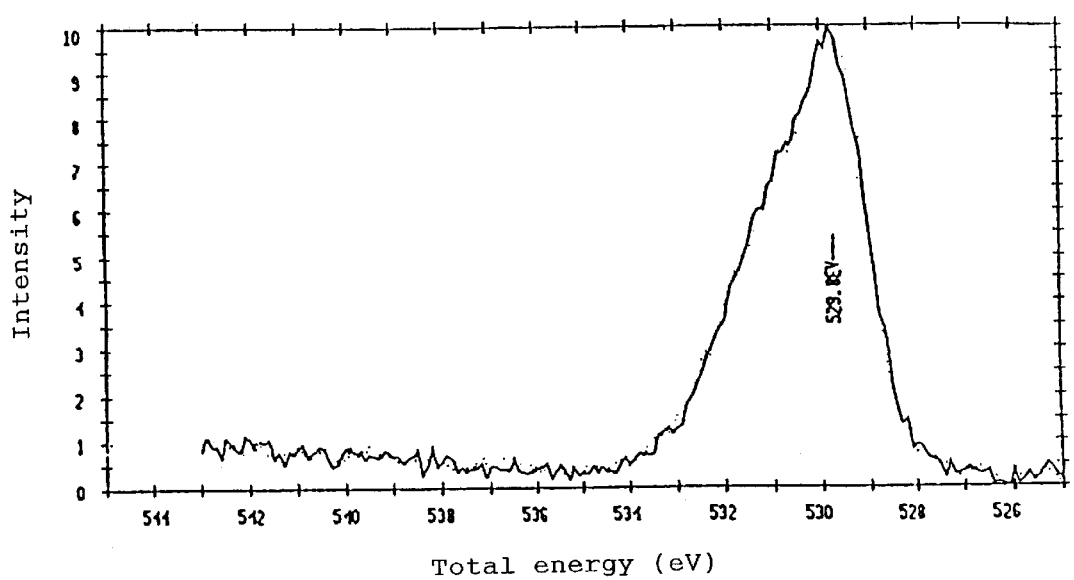
FIG. 12 is a diagram showing a binding energy peak of the 1S orbit of oxygen in a transparent conductive oxide (No. 1).

That is, the binding energy peak of the oxygen 1S orbit can be obtained as one oxygen 1S orbit peak, as shown in FIG. 12, using an X-ray photoelectron spectrometer (XPS).

Next, in the resultant oxygen 1S orbit peak, the base line thereof can be set up using Shirley's equation. Since the length from this base line to the peak can be obtained, the position in the middle of the length can be set.

Next, in the set position in the middle of the length, the binding energy width of the oxygen 1S orbit can be actually measured. Therefore, this energy width can be defined as the half band width.

(3) Control of the Half Band Width

① Water Content in a Vacuum Tank

The half band width of the binding energy peak of the oxygen 1S orbit of the transparent conductive oxide, which is measured by X-ray photoelectron spectroscopy, can easily be controlled by the water content in a vacuum tank at the time of sputtering.

That is, in order to obtain the transparent conductive oxide having a half band width of 3 eV or less, the water content in the vacuum tank is preferably set to a value within the range of $1 \times 10^{-5}$ to $1 \times 10^{-10}$ Pa when the film thereof is formed by sputtering.

More preferably, sputtering is performed while the water content in the vacuum tank is kept within the range of $1 \times 10^{-6}$ to $1 \times 10^{-10}$ Pa.

② Applied Voltage

When the film of the transparent conductive oxide is formed by sputtering, the half band width of the transparent conductive oxide can be controlled by the voltage applied to the sputtering target.

For example, the applied voltage is preferably set to a value within the range of 200 to 500 V in the same manner as in the fourth embodiment.

③ Sputtering Gas

In order to control the half band width of the transparent conductive oxide easily into the given range, a mixed gas of an inert gas, such as argon gas, and oxygen gas is preferably used as the sputtering gas (atmospheric gas).

In the case that argon gas is used as the inert gas in the mixed gas, the blend ratio of argon gas to oxygen gas is preferably set to a value of 0.6:0.4 to 0.999:0.001.

When such a mixed gas is used, the conductivity of the resultant transparent conductive oxide becomes good.

Moreover, the resultant transparent conductive oxide can have a high light transmittance.

(4) Substrate

As the substrate used when the transparent conductive oxide is formed, a glass substrate or a film or sheet substrate made of a transparent resin is preferred.

Examples of the glass substrate include transparent glass plates made of soda lime, lead glass, borosilicate glass, high-purity silica glass, non-alkali glass and so on. Of these glass plates, the non-alkali glass plate is more preferred since no alkali ions diffuse into the transparent conductive oxide.

The transparent resin is preferably a resin having a sufficiently high light transmittance and a superior electric insulation. Specific examples thereof include polyester resins such as polyethylene terephthalate, polycarbonate resin, polyarylate resin, polyether sulfone resin, acrylic resin, polyimide resin, polyamide resin, and maleimide resin.

The light transmittance of the transparent substrate used herein is 70% or more, preferably 80% or more, and more preferably 90% or more in either case of the transparent glass substrate or the substrate made of transparent resin.

The thickness of the transparent substrate is appropriately selected dependently on the use of the transparent conductive oxide or the material thereof. The thickness is usually set to a value within the range of 15 $\mu$m to 3 mm, and is preferably set to a value within the range of 50 $\mu$m to 1 mm.

(5) Intermediate Layer

In the fifth embodiment, an intermediate layer having a thickness of 0.5 to 10 $\mu$m is preferably disposed on the substrate surface at the side on which the transparent conductive oxide is disposed, in order to improve adhesion thereof to the transparent conductive oxide.

As this intermediate layer, there is suitably used a layer composed of a monolayer structure or a multilayer structure, which is made of a metal oxide (which may be a silicon oxide), a metal nitride (which may be a silicon nitride), a metal carbide (which may be a silicon carbide), a crosslinking resin or the like.

Examples of the metal oxide include $Al_2O_3$, $SiO_x$ (0<x $\leq$2), ZnO and $TiO_2$. Examples of the metal nitride include AlN, $Si_3N_4$, and TiN. Examples of the metal carbide include SiC and $B_4C$. Examples of the crosslinking resin include epoxy resin, phenoxy ether resin and acrylic resin.

In the case that the substrate made of a transparent resin is used as such an intermediate layer, its form preferably has a bilayer structure wherein a crosslinking layer and an inorganic material layer are successively deposited.

In the case that a transparent glass material is used as the transparent substrate, its form preferably has a bilayer structure wherein an inorganic material layer and a crosslinking resin layer are successively deposited. This is because such a bilayer structure causes a further improvement in the adhesion than a monolayer structure.

In either case, the transparent conductive oxide having better thermal stability can be obtained if the inorganic material layer is arranged on the side which the transparent conductive oxide of th e intermediate layer contacts.

In the case that the crosslinking layer is disposed as the intermediate layer on the surface of the substrate made of the transparent resin, an adhesive layer or a gas barrier layer may be interposed between the substrate surface and the crosslinking resin layer. Examples of an adhesive agent used to form such an adhesive layer include epoxy-type, acrylurethane-type, and phenoxyether-type adhesive agents. In the case that this transparent conductive material is used as a transparent electrode of a liquid crystal display element, the gas barrier layer makes it possible to prevent water vapor, oxygen or the like to diffuse into the liquid crystal.

(6) Transparent Conductive Oxide

① Etching

The transparent conductive oxide of the fifth embodiment is amorphous, and has superior etching property. Accordingly, this amorphous transparent conductive oxide can easily be etched without using a strong acid such as hydrochloric acid or aqua regia as an etching solution or requiring complicated operations, such as attachment of a protective film onto a wiring electrode, as performed for conventional ITO films.

It is preferred to use, as the etching solution for this amorphous transparent conductive oxide, an aqueous solution having a concentration of 3 to 10% by weight of oxalic acid, which does not cause corrosion of wiring electrodes of display devices.

The reasons for this are as follows. If the concentration of oxalic acid in the aqueous solution is thinner than 3% by weight, sufficient etching speed may not be obtained. On the other hand, if the concentration of oxalic acid in the aqueous solution is over 10% by weight, crystal may easily be generated in the solution.

② Heat Treatment

It is preferred to pattern the amorphous transparent conductive oxide by etching and subsequently crystallize the oxide by heat treatment, thereby improving the conductivity and further stabilizing the electric resistance at high temperature and high humidity.

In this case, the heat treatment temperature for the crystallization is preferably set to a value of 230° C. or higher, is more preferably set to a value of 250° C. or higher, and is still more preferably set to a value of 280° C. or higher.

As the heat treatment temperature is higher, a more favorable effect is generally produced since crystallizing speed is faster. However, the heat treatment temperature is preferably set to a temperature at which the substrate is thermally deformed, or lower. For example, in the case that a transparent resin is used as the substrate, the heat treatment temperature is preferably set to a temperature of 250° C. or lower. In the case that a glass substrate is used, the heat treatment temperature is preferably set to a temperature of 500° C. or lower.

③ Film Thickness

The thickness of the transparent conductive oxide can be appropriately selected dependently on the use thereof, the material of the substrate on which the transparent conductive oxide is deposited, and so on. The film thickness preferably ranges from 3 to 3,000 nm in the same manner as in the third embodiment or the forth embodiment.

Uses

Such a transparent conductive oxide can be suitably used as a transparent electrode for a liquid crystal display element, a transparent electrode for an electroluminescence element, a transparent electrode for a solar cell, or the like to make good use of superior transparency, conductivity and etching property.

Six Embodiment

The sixth embodiment is an embodiment related to the sixth invention, and is a transparent conductive oxide formed on a colored layer disposed on a substrate. This embodiment will be described by way of an example of a color filter.

(1) Structure

Figure 11A:
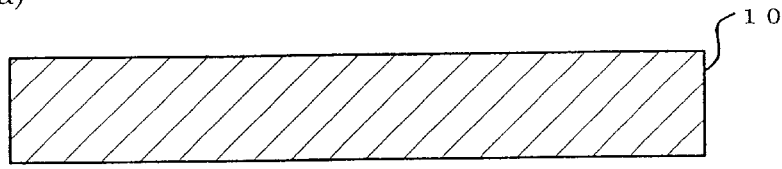
FIGS. 11 are process charts of producing a color filter.
Figure 11B:
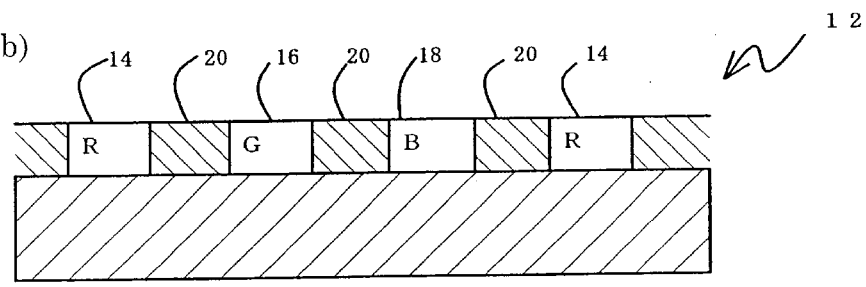
Figure 11C:
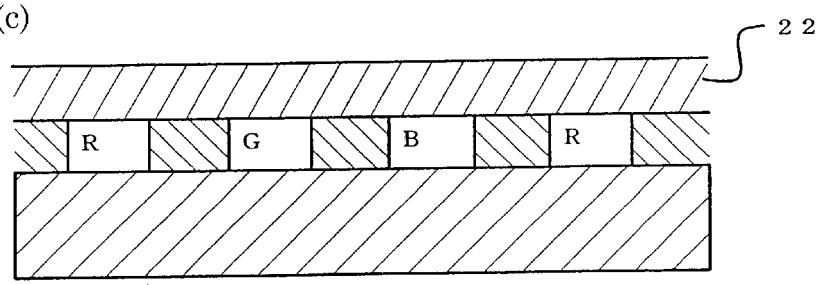
Figure 11D:
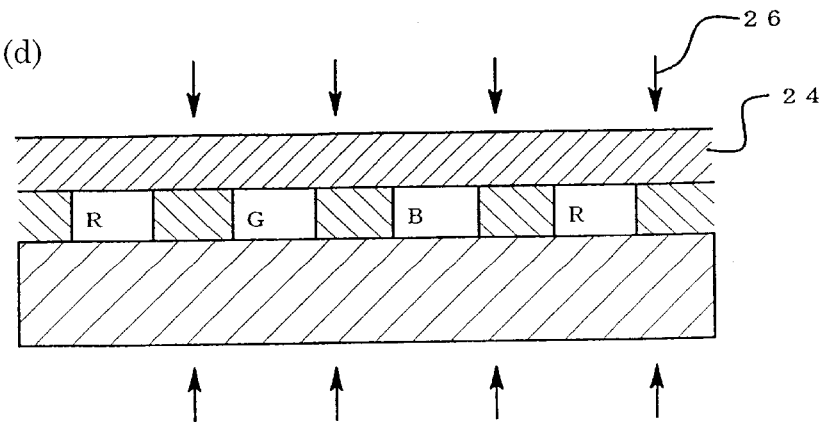

As illustrated in FIG. 11(d), the color filter of the sixth embodiment is a color filter made by depositing, on a substrate 10, an organic colored layer 12 and a transparent conductive film (electrode) 24 in this order. The organic colored layer 12 is composed of RGB pixels (red pixels, green pixels and blue pixels) 14, 16 and 18, and a black matrix (light shading layer) 20 disposed therebetween.

This color filter is a color filter which comprises 67 to 93%, preferably 74 to 93% by weight of indium oxide, 5 to 25%, preferably 5 to 20% by weight of tin oxide, and 2 to 8%, preferably 2 to 6% by weight of zinc oxide; has a composition that the atomic ratio of tin to all metal atoms is not less than the atomic ratio of zinc to all the atoms; and has the transparent conductive film 24 crystallized as an electrode by heat-treating (26) a transparent conductive film 22, which is amorphous when deposited, at a temperature of 200° C. or higher, more preferably at a temperature within the range of 230 to 300° C.

(2) Transparent Conductive Film

The reason why the composition of the transparent conductive oxide constituting the transparent conductive film is set into the above-mentioned range is that the sintered body target made of the transparent conductive oxide having this composition range makes sputtering at low temperature possible.

That is, by forming a transparent conductive film from the sintered body using sputtering, the transparent conductive film which is amorphous and superior in etching property can be formed on the organic colored layer even if the temperature of the substrate is set to 200° C. or lower.

Therefore, a fear that the organic colored layer as an undercoat is damaged in the sputtering is relieved.

The thickness of this transparent conductive film preferably ranges from 3 to 3,000 nm as described about the first embodiment.

(3) Substrate

Examples of the substrate used in the color filter include films and sheets made of glass or synthetic resins superior in transparency, such as polycarbonate, polyethylene terephthalate (PET), polyarylate, and polyethersulfone.

(4) Colored Layer

The organic colored layer disposed over the substrate may directly be formed on the substrate, or pixels of the organic colored layer may be separated from each other in plan and further light shading layer is disposed therebetween (black matrix).

Next, in this organic colored layer disposed on the substrate or adjacently to the light shading layer, a composition made of a coloring agent and a binder resin is used.

Examples of this coloring agent which can be used include perylene pigments, lake pigments, azo pigments, quinacridon pigments, anthraquinone pigments, anthracene pigments, isoindoline pigments, isoindolinone pigments, phthalocyanine pigments, triphenylmethane basic dyes, indanthrone pigments, indophenol pigments, cyanine pigments, and dioxadine pigments.

The binder resin is preferably a resin having heat resistance. There is suitably used, for example, epoxy resin, urethane resin, urea resin, acrylic resin, polyvinyl alcohol resin, polyimide resin, or a mixture thereof. Of these resins, polyimide is particularly preferred since it has high heat resistance.

Furthermore, the kind of the above-mentioned light shading layer is not particularly limited if it prevents interaction between the organic colored layer pieces. For example, a layer made of a chromium film, a partially-oxidized chromium film, an organic colored layer colored into black or the like is suitably used.

(5) Forming Method

① Formation of the Colored Layer

As illustrated in FIG. 11(b), in order to form the organic colored layer 12, it is preferred to blend and disperse respective pigments in red, blue and green, which are selected from the above-mentioned coloring agents, and a binder resin in a solvent for them, thereby producing a paste, and subsequently form RGB pixels by photolithography.

For example, it is advisable to apply the paste onto a substrate or a light shading layered worked into a stripe, semi-cure the paste, form a green organic colored layer (G pixels) in the form of a stripe corresponding to the pixels by photolithography, and then cure this.

Red and blue organic colored layers (R pixels and B pixels) may also be formed in the same manner.

If necessary, a protective layer made of polyimide resin may be formed on this organic colored layer.

② Formation of the Amorphous Transparent Conductive Film

Next, the amorphous transparent conductive film is formed on the organic colored layer or on the protective layer deposited on this organic colored layer, as illustrated in FIG. 11(c).

Preferably, this amorphous transparent conductive film is formed, using a target having a composition of 67 to 93%, preferably 74 to 93% by weight of indium oxide, 5 to 25%, preferably 5 to 20% by weight of tin oxide, and 2 to 8%, preferably 2 to 6% by weight of zinc oxide, wherein the atomic ratio of tin to all metal atoms is not less than the atomic ratio of zinc to all the atoms and further the crystal grain size of a contained hexagonal layered compound is 5 $\mu$m or less.

When the transparent conductive film is formed on the organic colored layer or the protective layer, a magnetron sputtering machine is suitably used.

Therefore, conditions when the amorphous transparent conductive film is formed vary to some extent dependently on the area or the thickness of the target. The amorphous transparent conductive film having a desired thickness can be usually obtained by setting plasma output into the range of 0.3 to 4 W per cm$^2$ of the target area and setting forming time to a value of 5 to 120 minutes.

The thickness of the amorphous transparent conductive film, which varies dependently on the kind of a display device to which the film is applied, usually ranges from 3 to 3,000 nm, preferably ranges from 20 to 600 nm, and more preferably ranges from 30 to 200 nm.

③ Etching of the Amorphous Transparent Conductive Film

In etching property, the resultant amorphous transparent conductive film is far better than any crystalline transparent conductive film. Therefore, in etching treatment for patterning, there can be used an aqueous solution of a weak acid which does not cause corrosion of wiring material, for example, an aqueous solution having an oxalic acid concentration of 3 to 10% by weight.

For example, under conditions of 40 to 50° C. using a solution having an oxalic acid concentration of 5% by weight as an etching solution, the amorphous transparent conductive film has such a superior etching property that the etching speed is 0.1 $\mu$m/minute or more.

④ Crystallization of the Transparent Conductive Film

Next, the formed amorphous transparent conductive film is preferably subjected to heat treatment (26) so as to be crystallized after the patterning of the film by the etching, as illustrated in FIG. 11(d). In this way, a crystalline transparent conductive film having superior heat resistance and moisture resistance is prepared.

Preferably, the heat treatment condition in this case is set to 200° C. or higher, preferably 230° C. or higher, and more preferably 250° C. or higher, and treatment time is set to a value of 0.5 to 3 hours.

Seventh Embodiment

The seventh embodiment is an embodiment related to a process for producing the first and second inventions, and is a first process for producing a sputtering target containing a hexagonal layered compound represented by In$_2$O$_3$(ZnO)$_m$ wherein m is an integer of 2 to 20, the crystal grain size of the hexagonal layered compound being a value of 5 $\mu$m or less. This process is a process for producing the sputtering target, comprising the steps (1) to (3):

(1) the step of blending indium oxide powder with zinc oxide powder having an average grain size of 2 $\mu$m or less, (2) the step of making a formed body wherein the atomic ratio of In/(In+Zn) is within the range of 0.75 to 0.97, and (3) the step of sintering the formed body at a temperature of 1,400° C. or higher.

(1) Blending Step

① Mixing Pulverizer

Respective metal oxides used as ingredients for producing the target are homogenously mixed and pulverized using an ordinary mixing pulverizer, such as a wet ball mill, bead mill, or an ultrasonic device.

② Average Grain Size of the Ingredient Powders

In the mixing and pulverizing the ingredient powders, the powders are preferably pulverized into finer grains since the crystal grain size of the hexagonal layered compound in the target is easily controlled (5 $\mu$m or less). Specifically, the indium oxide powder, the zinc oxide power and so on are preferably subjected to mixing pulverization in the manner that the average grain size thereof will be 2 $\mu$m or less, more preferably within the range of 0.1 to 1.8 $\mu$m, still more preferably within the range of 0.3 to 1.5 $\mu$m, and still more and more preferably within the range of 0.5 to 1.2 $\mu$m.

In the meantime, in the case that tin oxide powder is blended to generate a spinel structural compound, the average grain size of the tin oxide powder is preferably set to a value within the range of 0.01 to 1 $\mu$m, is more preferably set to a value within the range of 0.1 to 0.7 $\mu$m, and is still more preferably within the range of 0.3 to 0.5 $\mu$m.

This is because by limiting the average grain size of the tin oxide powder into such a range, the crystal grain size of the hexagonal layered compound and the spinel compound in the target can easily be controlled (5 $\mu$m or less).

① Kind of the Ingredient Powders

The indium compound and the zinc compound used as the ingredients are preferably oxides or compounds which will be oxides after sintering, that is, indium oxide precursors or zinc oxide precursors.

Examples of the indium oxide precursors and the zinc oxide precursors include sulfides, sulfates, nitrates, halides (chlorides, bromides and so on), carbonates, organic acid salts (acetates, oxalates, propionates, naphthanoates and so on), alkoxide compounds (methoxide compounds, ethoxide compounds, and so on), and organic metal complexes (acetyl acetonate compounds and so on) of indium and zinc.

Of these, nitrates, organic acid salts, alkoxides and organic metal complexes are preferred since they are completely thermally decomposed even at low temperature so that no impurities remain.

(2) Pre-sintering Step

Next, this mixture is preferably pre-sintered, which is an optional step, after the mixture of the indium compound, the zinc compound and the tin compound is obtained.

In this pre-sintering step, heat treatment is preferably performed at 500 to 1,200° C. for 1 to 100 hours.

This is because the thermal decomposition of the indium compound, the zinc compound and the tin compound may become insufficient under the heat treatment condition at less than 500° C. or for less than 1 hour. On the other hand, if the heat treatment condition is over 1,200° C. or over 100 hours, the grain may be made coarse and large-sized.

It is therefore particularly preferred to perform the heat treatment (pre-sintering) under the conditions of the temperature range of 800 to 1,200° C. for 2 to 50 hours.

The pre-sintered body obtained herein is preferably pulverized before being formed and sintered. The pulverization of the pre-sintered body is preferably performed with a ball mill, a roll mill, a pearl mill, a jet mill or the like, in the manner that the grain size thereof will be from 0.01 to 1.0 $\mu$m.

(3) Forming Step

Next, the resultant pre-sintered body is used to be formed into a shape suitable for a target in the forming step.

For such forming processing, mold forming, casting forming, injection forming or the like is performed. In order to obtain a sintered body having a high sintered density, it is preferred to form the pre-sintered body by CIP (cold isostatic press) or the like, and subsequently subject the resultant formed body to sintering treatment, which will be described after.

In the forming processing, a forming aid such as polyvinyl alcohol, methyl cellulose, polywax or oleic acid may be used.

(4) Sintering Step

Next, the resultant fine powder is granulated and then formed into a desired shape by press forming, and the formed body is sintered and subjected to HIP (hot isostatic press) sintering or the like.

About sintering conditions in this case, the sintering is performed in the atmosphere of oxygen gas or pressured oxygen gas, usually at 1,400 to 1,600° C., preferably at 1,430 to 1,550° C., and more preferably at 1,500 to 1,540° C. for 30 minutes to 72 hours, preferably for 10 to 48 hours.

In the meantime, if the mixture of the indium oxide power and the zinc oxide powder is sintered in the atmosphere containing no oxygen or is sintered at a temperature of less than 1,400° C., the reactivity of zinc oxide with indium oxide drops so that crystal of a hexagonal layered compound may be insufficiently formed. Consequently, the density of the resultant target cannot be sufficiently improved so that the generation of nodules cannot be sufficiently suppressed in the sputtering.

The temperature-raising rate in this case is preferably from 10 to 50° C./minute.

If the mixture of the indium oxide powder and the zinc oxide powder having the given ratio therebetween is sintered in the atmosphere of oxygen gas or pressured oxygen gas at a temperature of 1,400° C. or higher in this way, crystal of the hexagonal layered compound made of indium oxide and zinc oxide is generated to be unevenly distributed in gaps between the crystal grains of indium oxide. This suppresses crystal growth of indium oxide so that a sintered body having a fine crystal texture is formed.

In the above-mentioned blending step, at least zinc oxide having an average grain size of 2 $\mu$m or less is used; therefore, the sintered body having a crystal grain size of 5 $\mu$m or less is obtained.

(5) Reducing Step

In order to make the bulk resistance of the resultant sintered body uniform as a whole, reducing treatment is preferably performed in a reducing step, which is an optional step.

As such a reducing method, there is used a method based on reducing gas, or reduction based on vacuum sintering or an inert gas.

In the case based on the reducing gas, hydrogen, methane, carbon monoxide, a mixed gas of these gases and oxygen, or the like may be used.

In the case of the reduction based on sintering in the inert gas, nitrogen, argon, a mixed gas of these gases and oxygen, or the like may be used.

Reduction temperature is from 100 to 800° C., preferably from 200 to 800° C. Reduction time is from 0.01 to 10 hours, preferably from 0.05 to 5 hours.

(6) Working Step

Preferably, the sintered body obtained by such sintering is cut into a shape suitable for being fitted to a sputtering machine in a working step, and a fitting member is attached to the cut body to prepare a sputtering target.

In the sputtering target obtained in the last step, the composition of the respective metal oxides, which are constituent elements of the target, is set into the above-mentioned range, and grains having a size of 2 $\mu$m or less are used to sinter the oxides in the atmosphere of oxygen gas or pressured oxygen gas at a temperature of 1,400° C. or higher, thereby causing indium oxide and zinc oxide to be present in the form of hexagonal layered compound crystal. Therefore, the bulk resistance of this target is reduced and the target has a fine crystal texture having a crystal grain size of 5 $\mu$m or less.

Accordingly, when this target is used to form a film by sputtering, the generation of nodules is suppressed. Since the scattering of the nodules by plasma is markedly reduced, the sputtering can be made stable so that a high-quality transparent conductive oxide to which no alien substances are attached can be obtained.

Eighth Embodiment

The eighth embodiment is related to another process for producing the first and second inventions, and is a second process for producing a sputtering target containing a hexagonal layered compound represented by $In_2O_3(ZnO)_m$ wherein m is an integer of 2 to 20, the crystal grain size of the hexagonal layered compound being a value of 5 $\mu$m or less. This process is a process for producing the sputtering target, characterized by comprising the steps (1) to (5):

(1) the step of producing a hexagonal layered compound represented by $In_2O_3(ZnO)_m$ wherein m is an integer of 2 to 20, (2) the step of adjusting the produced hexagonal layered compound to have a grain size of 5 $\mu$m or less, (3) the step of blending the hexagonal layered compound having the adjusted grain size with indium oxide powder, (4) the step of making a formed body wherein the atomic ratio of In/(In+Zn) is within the range of 0.75 to 0.97, and (5) the step of sintering the formed body at a temperature of 1,400° C. or higher.

If the sputtering target is produced in this way, the average grain size of the hexagonal layered compound and so on in the target can be very strictly adjusted. Therefore, the generation of nodules can be effectively prevented when the target is used to perform sputtering.

(1) Step of Producing a Hexagonal Layered Compound

When a hexagonal layered compound represented by $In_2O_3(ZnO)_m$ wherein m is an integer of 2 to 20 is produced, it is preferred to use a wet ball mill, a bead mill, or an ultrasonic device to mix homogeneously respective powders of indium oxide ($In_2O_3$) and zinc oxide (ZnO), which are ingredients, in the same manner as in the seventh embodiment.

Next, the mixture is preferably subjected to heat treatment at a temperature of 1200 to 1300° C. for 30 minutes to 3 hours when the hexagonal layered compound is obtained.

Since the average grain size of the hexagonal layered compound is controlled in the grain size adjusting step which will be described later, indium oxide powder and zinc oxide powder having an average grain size of 2 $\mu$m or less are not necessarily necessary in the step of producing the hexagonal layered compound.

(2) Step of Adjusting the Grain Size of the Hexagonal Layered Compound

This is a step of making the average grain size of the produced hexagonal layered compound to a value of 5 $\mu$m or less. By adjusting the grain size of the hexagonal layered compound in this way, the generation of nodules can be effectively prevented when the resultant target is used.

However, if the average grain size of the hexagonal layered compound is made excessively small, the control thereof may become difficult or the yield may drop to result in economical disadvantages. Therefore, the average grain size of the hexagonal layered compound is more preferably set to a value within the range of 0.1 to 4 $\mu$m, and is still more preferably set to a value within the range of 0.5 to 3 $\mu$m.

The method of adjusting the grain size of the hexagonal layered compound is not particularly limited. However, the adjustment can be carried out by pulverizing the compound homogeneously in, for example, a wet ball mill, a bead mill, or an ultrasonic device and then sieving the resultant grains.

(3) Step of Blending Indium Oxide Powder

This is a step of blending the hexagonal layered compound having the adjusted grain size with indium oxide powder.

That is, the indium oxide powder is preferably blended in the manner that the atomic ratio of In/(In+Zn) will be within the range of 0.75 to 0.97 in the formed body.

It is also preferred to add a spinel compound together with the indium oxide powder. That is, it is also preferred to subject zinc oxide (ZnO) and tin oxide ($SnO_2$) to heat treatment at a temperature of 800 to 1200° C. for 30 minutes to 3 hours, subsequently adjust the grain size thereof to 5 $\mu$m or less, and perform the addition at this stage.

(4) Step of Making a Formed Body

The conditions in this step are preferably made to the same as in the seventh embodiment. That is, in order to obtain a dense target, it is preferred to make a formed body beforehand by CIP (cold isostatic press) or the like.

(5) Sintering Step

The conditions in this step are preferably made to the same as in the seventh embodiment. That is, it is preferred to sinter the formed body obtained in (4) in the atmosphere of oxygen gas or pressured oxygen gas at 1,400 to 1,600° C. for 30 minutes to 72 hours.

EXAMPLES

The present invention will be described in more detail by way of Examples and Comparative Examples.

Example 1

(1) Production and Evaluation of a Sputtering Target

① Production of a Target

Indium oxide having an average grain size of 1 $\mu$m and zinc oxide having an average grain size of 1 $\mu$m, as ingredients, were blended with each other in the manner that the atomic ratio of In/(In+Zn) would be 0.83, and this was supplied to a wet ball mill, and mixed and pulverized for 72 hours to yield fine ingredient powder.

The fine ingredient powder was subjected to granulation, and subsequently the resultant grains were press-formed into a size having a diameter of 10 cm and a thickness of 5 mm. This was put into a firing furnace and fired in pressured oxygen gas at 1,450° C. for 36 hours to yield a sintered body (target) made of the transparent conductive material.

② Evaluation of the Target

About the resultant target, the density, the bulk resistance, the X-ray diffraction analysis, the crystal grain size and various physical properties thereof were measured.

As a result, the density was 6.8 g/cm$^3$, and the bulk resistance measured by a four-probe method was $0.91 \times 10^{-3}$ $\Omega \cdot$cm.

About a sample collected from this sintered body, the state of the crystal in the transparent conductive material was observed by X-ray diffraction analysis. As a result, it was proved that a hexagonal layered compound represented by $In_2O_3(ZnO)_3$ and made of indium oxide and zinc oxide was present in the resultant target.

The resultant sintered body was wrapped with a resin, and the surface thereof was polished with alumina grains having a grain size of 0.05 $\mu$m. Thereafter, measured was the maximum size of the crystal grains of the hexagonal layered compound observed in a frame 30 $\mu$m square of the sintered body surface enlarged by 5,000 times with JXA-8621MX (made by JEOL Ltd.) as an EPMA. At three points, the maximum grain sizes were measured in the frame in the same way. The average value thereof was calculated. In this way, it was proved that the crystal grain size of this sintered body was 3.0 $\mu$m.

The sintered body obtained in ① was cut to make a sputtering target [A1] having a diameter of 10 cm and a thickness of about 5 mm. Physical properties thereof were then measured.

(2) Formation of a Transparent Conductive Oxide Into a Film

The sputtering target [A1] obtained in the above-mentioned (1) was fitted to a DC magnetron sputtering machine to form a film of a transparent conductive oxide on a glass substrate at room temperature.

About sputtering conditions herein, argon gas to which oxygen gas of an appropriate amount was incorporated was used, and sputtering pressure, attainment pressure, substrate temperature, applied electric power, and film-forming time were $3 \times 10^{-1}$ Pa, $5 \times 10^{-4}$ Pa, 25° C., 100 W, and 20 minutes, respectively.

As a result thereof, a transparent conductive glass wherein a transparent conductive oxide having a film thickness of about 120 nm was formed on the glass substrate was obtained.

(3) The Number of Generated Nodules

Sputtering was continuously performed for 8 hours under the same conditions as in the above-mentioned (2) except that the sputtering target [A1] obtained in the (1) was fitted to the DC magnetron sputtering machine and a mixed gas obtained by adding 3% hydrogen gas to argon gas was used.

Next, the target surface after the sputtering was enlarged by 30 times and observed by means of a stereoscopic microscope. At each of 3 positions on the target, the number of generated nodules having a size of 20 $\mu$m or more was measured in a visual field of 900 mm$^2$, and then the average thereof was calculated.

As a result, nodules were not observed at all in the surface of the sputtering target [A1] obtained in the above-mentioned (1), as shown in FIG. 1 (photograph).

(4) Evaluation of Physical Properties of the Transparent Conductive Oxide

About the conductivity of the transparent conductive oxide on the transparent conductive glass, which was obtained in the above-mentioned (2), the resistivity thereof was measured by a four-probe method. As a result, it was $2.5 \times 10^{-4}$ Ω·cm.

It was also proved by X-ray diffusion analysis that this transparent conductive oxide was amorphous. Meanwhile, it was proved that the smoothness of the film surface was good since the P-V value (according to JIS B0601) thereof was 5 nm.

Furthermore, about the transparency of this transparent conductive oxide, a spectrophotometer demonstrated that the light transmittance about light having a wavelength of 500 nm was 82%. Thus, the transparency was also superior.

Examples 2–3

(1) Production of Sputtering Targets

Targets [B1] and [C1] were obtained in the same way as in the (1) of Example 1 except that in Examples 2 and 3 there were used, as ingredients, a mixture wherein the same indium oxide and zinc oxide as in Example 1 were mixed in the manner that the atomic ratio of indium [In/(In+Zn)] would be 0.93, and a mixture wherein the same indium oxide and zinc oxide as in Example 1 were mixed in the manner that the atomic ratio of indium [In/(In+Zn)] would be 0.95, respectively.

Measurement results of the compositions and physical properties of the targets [B1] and [C1] obtained herein are shown in Table 1.

(2) Evaluation of the Targets and Transparent Conductive Oxides

In the same way as in Example 1, films of transparent conductive oxides were made from the resultant targets [B1] and [C1], respectively. The targets and the transparent conductive oxides were evaluated. The resultant results are shown in Table 2.

Comparative Examples 1–2

(1) Production of Sputtering Targets

Effects of the atomic ratio represented by [In/(In+Zn)] in the target were investigated.

That is, targets [D1] and [E1] were obtained in the same way as in Example 1 except that in Comparative Examples 1 and 2 there were used, as ingredients, a mixture wherein the same indium oxide and zinc oxide as in Example 1 were mixed in the manner that the atomic ratio of indium [In/(In+Zn)] would be 0.98, and a mixture wherein the same indium oxide and zinc oxide as in Example 1 were mixed in the manner that the atomic ratio of indium [In/(In+Zn)] would be 0.6, respectively.

Measurement results of the compositions and physical properties of the resultant targets [D1] and [E1] are shown in Table 1.

(2) Evaluation of the Targets and Transparent Conductive Oxides

In the same way as in Example 1, films of transparent conductive oxides were made from the resultant targets [D1] and [E1], respectively. The targets and the transparent conductive oxides were evaluated. The resultant results are shown in Table 2.

Comparative Example 3

(1) Production of a Sputtering Target

Effects of the atomic ratio represented by [In/(In+Zn)] in the target and sintering temperature were investigated.

That is, targets [F1] was obtained in the same way as in Example 1 except that there was used, as an ingredient, a mixture of indium oxide and tin oxide wherein they were mixed in the manner that the atomic ratio of indium [In/(In+Sn)] would be 0.90 and the sintering temperature of a formed body obtained from this ingredient was set to 1,400° C.

Measurement results of the resultant composition and physical properties of the target [F1] are shown in Table 1.

(2) Evaluation of the Target and a Transparent Conductive Oxide

In the same way as in Example 1, a film of a transparent conductive oxide was made from the resultant target [F1]. The target and the transparent conductive oxide were evaluated. The resultant results are shown in Table 2.

TABLE 1

|  | Example | | | Comparative Example | | |
|---|---|---|---|---|---|---|
|  | 1 | 2 | 3 | 1 | 2 | 3 |
| In/(In + Zn) | 0.83 | 0.93 | 0.95 | 0.98 | 0.60 | — |
| In/(In + Sn) | — | — | — | — | — | 0.90 |
| Sintered body Density (g/cm³) | 6.8 | 6.8 | 6.9 | 6.9 | 6.3 | 6.9 |
| Bulk resistance (mΩcm) | 0.91 | 0.94 | 0.97 | 2.1 | 5.4 | 0.62 |
| Crystal grain size (μm) | 3.0 | 3.8 | 4.6 | 7.8 | 9.8 | 18.0 |
| Target symbol | A1 | B1 | C1 | D1 | E1 | F1 |

TABLE 2

|  | Target symbol | Number of Nodules (/8 Hrs/ 900 mm²) | Resistivity (μΩ· cm) | Transparent conductive oxide film Crystallinity |
|---|---|---|---|---|
| Example | | | | |
| 1 | A1 | 0 | 250 | Amorphous |
| 2 | B1 | 0 | 230 | Amorphous |
| 3 | C1 | 0 | 180 | Amorphous |
| Comparative Example | | | | |
| 1 | D1 | 18 | 320 | Microcrystalline |
| 2 | E1 | 8 | 680 | Amorphous |
| 3 | F1 | 32 | 420 | Crystalline |

Example 4

(1) Production of a Sputtering Target

Indium oxide powder having an average grain size of 1 μm, zinc oxide powder having an average grain size of 1 μm and tin oxide power having an average grain size of 0.5 μm, as ingredients, were supplied to a wet ball mill in the manner that the percentages of indium oxide, zinc oxide and tin oxide would be 75% by weight, 5.5% by weight, and 19.5% by weight, respectively. Next, the ingredients were blended and pulverized to yield fine ingredient powder.

The fine ingredient powder obtained herein was subjected to granulation, and subsequently the resultant grains were press-formed into a size having a diameter of 10 cm and a thickness of 5 mm. This was put into a firing furnace and fired in pressured oxygen gas at 1,450° C. for 36 hours to yield a sintered body made of the transparent conductive material.

The density of this sintered body was 6.8 g/cm³, and the bulk resistance measured by a four-probe method was $0.84 \times 10^{-3}$ Ω·cm.

About a sample collected from this sintered body, the state of the crystal in the transparent conductive material was observed by X-ray diffraction analysis. As a result, as shown in FIG. 6, it was proved that indium oxide and zinc oxide were present as a spinel structural compound represented by $Zn_2SnO_4$.

Next, the resultant sintered body was wrapped with a resin, and the surface thereof was polished with alumina grains having a grain size of 0.5 μm. Thereafter, the EPMA was used to measure the maximum size of the maximum crystal grain of the hexagonal layered compound and the spinel structural compound in the sintered body surface (inside a frame 30 μm square) enlarged by 5,000 times.

At three points, the maximum grain sizes of the maximum crystal grains were measured in the frame in the same way. The average value thereof was calculated. As a result, it was proved that the crystal grain size of the hexagonal layered compound and the spinel structural compound was 4.1 μm.

Next, the thus obtained sintered body was cut to make a sputtering target [A2] having a diameter of about 10 cm and a thickness of about 5 mm.

Measurement results of the composition and physical properties of the target [A2] obtained herein are shown in Table 3.

(2) Formation of a Transparent Conductive Oxide Into a Film

The sputtering target [A2] obtained in the above-mentioned (1) was fitted to the DC magnetron sputtering machine to form a transparent conductive oxide film on a glass substrate at room temperature.

About sputtering conditions, argon gas to which oxygen gas of an appropriate amount was incorporated was used, and sputtering pressure, attainment pressure, substrate temperature, applied electric power, and film-forming time were $3\times10^{-1}$ Pa, $5\times10^{-4}$ Pa, 25° C., 100 W, and 20 minutes, respectively.

As a result thereof, a transparent conductive glass wherein the transparent conductive oxide film having a thickness of about 120 nm was formed on the glass substrate was obtained.

(3) The Number of Generated Nodules

Next, sputtering was continuously performed for 8 hours under the same conditions as in the above-mentioned (2) except that the sputtering target [A2] obtained in the (1) was fitted to the DC magnetron sputtering machine and subsequently a mixed gas obtained by adding 3% hydrogen gas to argon gas was used.

Next, the target surface after the sputtering was enlarged by 30 times and observed by means of the stereoscopic microscope. At each of 3 positions on the target, the number of generated nodules having a size of 20 μm or more was measured in a visual field of 900 mm², and then the average thereof was calculated.

As a result, nodules were not observed at all in the surface of the sputtering target [A2] obtained in the above-mentioned (1). The result of the number of the generated nodules is shown in Table 4.

(4) Evaluation of the Transparent Conductive Oxide Film

The conductivity (resistivity) of the transparent conductive oxide film obtained in the above-mentioned (2) was measured by a four-probe method. As a result, it was $2.8\times10^{-4}$ Ω·cm.

It was also proved by X-ray diffraction analysis that the transparent conductive oxide film was amorphous. Meanwhile, it was proved that the P-V value thereof measured by a surface roughness meter was 5 nm and the smoothness of the film surface was good.

Furthermore, about the transparency of this transparent conductive oxide film, the light transmittance (wavelength: 500 nm) was measured with the spectrophotometer. As a result, this light transmittance was 82%. Thus, it was proved that the resultant transparent conductive oxide film had superior transparency.

(5) Heat Treatment of the Transparent Conductive Oxide Film

The transparent conductive glass obtained in the above-mentioned (2) was heat-treated. Conditions of the heat treatment herein were as follows. The glass was heated up to 215° C. at a temperature-rising rate of 20° C./minute in the atmosphere of argon and this temperature was kept for 1 hour.

As a result, the resultant transparent conductive oxide film was amorphous but the resistivity thereof was $2.1\times10^{-4}$ Ω·cm.

Therefore, it was proved that this heat treatment made it possible to reduce the resistivity of the transparent conductive oxide film by about 25%. A change in the resistivity by the heat treatment of this transparent conductive oxide film is shown in Table 4.

(6) Etching Workability of the Transparent Conductive Oxide Film

Next, the etching workability of the resultant transparent conductive oxide film was evaluated.

That is, an aqueous oxalic acid solution (concentration: 5% by weight) of 40° C. was used to etch parts of the transparent conductive oxide film on the transparent conductive glass into the form of lines having a width of 10 to 100 μm. A section of the boundary portion between the etched portions and the non-etched portions was observed with an electron microscope.

As a result, it was observed that no transparent conductive oxide film remained in the etched portions and the edge portion of the transparent conductive oxide film remaining in the non-etched portions had a sectional shape inclined smoothly toward the etched portions. Thus, it was proved that the resultant transparent conductive oxide film had superior etching workability.

The etching workability of this transparent conductive oxide film was evaluated according to the following criteria.

⊚: The film can be etched to have a line width of 10 μm, and residues are not observed at all.

○: The film can be etched to have a line width of 50 μm, and residues are not observed.

Δ: The film can be etched to have a line width of 100 μm, and residues are partially observed.

×: It is difficult that the film is etched to have a line width of 100 μm, and marked residues are observed.

Examples 5–8

(1) Production of Sputtering Targets

Effect of the blend proportions of ingredients was investigated.

That is, in Example 5, the blend proportions of indium oxide, tin oxide and zinc oxide were set to 73% by weight, 20% by weight and 7% by weight, respectively. In Example 6, the blend proportions of indium oxide, tin oxide and zinc oxide were set to 87% by weight, 10% by weight and 3% by weight, respectively. In Example 7, the blend proportions of indium oxide, tin oxide and zinc oxide were set to 88% by weight, 10% by weight and 2% by weight, respectively. In Example 8, the blend proportions of indium oxide, tin oxide and zinc oxide were set to 91% by weight, 7% by weight and 2% by weight, respectively. In the same way as in Example 4 except the above-mentioned proportions, targets [B2], [C2], [D2] and [E2] were produced.

Measurement results of the compositions and physical properties of the resultant targets [B2], [C2], [D2] and [E2] are shown in Table 3.

(2) Evaluations of the Targets and Transparent Conductive Oxide Films

In the same way as in Example 4, a film of a transparent conductive oxides was made from each of the resultant targets [B2], [C2], [D2] and [E2]. The targets and the transparent conductive oxides were evaluated. The resultant results are shown in Table 4.

Comparative Example 4

(1) Production of a Sputtering Target

A sputtering target [F2] was obtained in the same way as in Example 4 except that zinc oxide powder having an average grain size of 3 μm was used as an ingredient and further about the blend proportions of ingredients, indium oxide and zinc oxide were set to 90% by weight and 10% by weight, respectively. Measurement results of the composition and physical properties of the resultant target [F2] obtained herein are shown in Table 3.

(2) Evaluation of the Target and a Transparent Conductive Oxide Film

In the same way as in Example 4, a film of transparent conductive oxide was formed from the resultant target [F2] to evaluate the target and the transparent conductive oxide. The obtained results are shown in Table 4.

Comparative Example 5–7

(1) Production of Sputtering Targets

Effect of the blend proportions of ingredients was investigated.

That is, in Comparative Example 5, the blend proportions of indium oxide and tin oxide were set to 90% by weight and 10% by weight, respectively. In Comparative Example 6, the blend proportions of indium oxide, tin oxide and zinc oxide were set to 87% by weight, 10% by weight and 3% by weight, respectively. In Comparative Example 7, the blend proportions of indium oxide, tin oxide and zinc oxide were set to 90% by weight, 5% by weight and 5% by weight, respectively.

Next, in Comparative Examples 5 and 7, targets [G2] and [I2] were obtained, respectively, in the same way as in Example 4.

In Comparative Example 6, a target [H2] was obtained in the same way as in Example 4 except that the sintering temperature of the formed body was set to 1,100° C.

Measurement results of the compositions and physical properties of the resultant targets [G2], [H2] and [I2] are shown in Table 3.

(2) Evaluation of the Targets and Transparent Conductive Oxide Films

In the same way as in Example 4, a film of transparent conductive oxide was formed from each of the resultant targets [G2], [H2] and [I2]. In this way, the targets and the transparent conductive oxides were evaluated. The obtained results are shown in Table 4.

About the target [H2] of Comparative Example 6, the crystallinity thereof was observed by X-ray diffraction analysis. As a result, no hexagonal layered compound represented by $In_2O_3(ZnO)_m$ wherein m is an integer of 2 to 20 was observed.

TABLE 3

|  | Example | | | | | Comparative Example | | | |
| --- | --- | --- | --- | --- | --- | --- | --- | --- | --- |
|  | 4 | 5 | 6 | 7 | 8 | 4 | 5 | 6 | 7 |
| $In_2O_3$ (% by weight) | 75 | 73 | 87 | 88 | 91 | 90 | 90 | 87 | 90 |
| $SnO_2$ (% by weight) | 19.5 | 20 | 10 | 10 | 7 | 0 | 10 | 10 | 5 |
| ZnO (% by weight) | 5.5 | 7 | 3 | 2 | 2 | 10 | 0 | 3 | 5 |
| Sintered body Density (g/cm³) | 6.8 | 6.8 | 6.9 | 6.9 | 7.0 | 6.9 | 7.0 | 6.3 | 6.4 |
| Bulk resistance (mΩcm) | .84 | .94 | .87 | .83 | .87 | 2.1 | .87 | 4.3 | 1.5 |
| Crystal grain Size (μm) | 4.1 | 3.4 | 3.8 | 4.5 | 4.8 | 4.2 | 18 | 7.4 | 4.8 |
| Target symbol | A2 | B2 | C2 | D2 | E2 | F2 | G2 | H2 | I2 |

TABLE 4

| | | | Transparent conductive oxide film | | | | |
| --- | --- | --- | --- | --- | --- | --- | --- |
| | | | Immediately after the formation of the film | | | After heat treatment | |
| | Target symbol | Number Of generated Nodules | Resistivity (μΩ·cm) | Crystallinity | Etching property | Resistivity (μΩ·cm) | Crystallinity |
| Example | | | | | | | |
| 4 | A2 | 0 | 280 | Amorphous | ⊙ | 210 | Amorphous |
| 5 | B2 | 0 | 290 | Amorphous | ⊙ | 230 | Amorphous |
| 6 | C2 | 0 | 270 | Amorphous | ○ | 180 | Microcrystalline |

TABLE 4-continued

| | | | Transparent conductive oxide film | | | | |
|---|---|---|---|---|---|---|---|
| | | | Immediately after the formation of the film | | | After heat treatment | |
| | Target symbol | Number Of generated Nodules | Resistivity ($\mu\Omega \cdot cm$) | Crystallinity | Etching property | Resistivity ($\mu\Omega \cdot cm$) | Crystallinity |
| 7 | D2 | 0 | 260 | Amorphous | ○ | 170 | Microcrystalline |
| 8 | E2 | 0 | 240 | Amorphous | Δ | 170 | Microcrystalline |
| Comparative Example | | | | | | | |
| 4 | F2 | 0 | 380 | Amorphous | ⊚ | 380 | Amorphous |
| 5 | G2 | 32 | 260 | Crystalline | x | 190 | Crystalline |
| 6 | H2 | 18 | 320 | Amorphous | Δ | 250 | Crystalline |
| 7 | I2 | 21 | 260 | Amorphous | Δ | 880 | Crystalline |

Example 9

(1) Production of a Conductive Transparent Film

As a substrate made of a transparent resin, a biaxially drawn polyester film [polyethylene terephthalate film] having a thickness of 100 $\mu$m was used. A transparent conductive oxide film was produced on this film by sputtering using as a target a sintered body made of $In_2O_3(ZnO)_3$ which was a hexagonal layered compound (crystal grain size: 4.0 $\mu$m or less), $In_2O_3$ and $SnO_2$ [In/(In+Zn)=0.93, Sn/(In+Zn+Sn)= 0.08, and relative density=98%]. In this way, a conductive transparent film was produced.

That is, the polyester film was fitted to a RF sputtering machine, and the pressure of its vacuum tank was reduced to $1\times10^{-3}$ Pa or less. Thereafter, a mixed gas of argon gas (purity: 99.99%) and oxygen gas [concentration of oxygen gas=0.28%] was introduced thereto so as to have a pressure of $1\times10^{-1}$ Pa (oxygen partial pressure: $2.8\times10^{-4}$ Pa). Under conditions of a RF output of 1.2 W/cm$^2$ and a substrate temperature of 200° C., a transparent conductive oxide film having a thickness of 250 nm was formed.

(2) Evaluation of the Conductive Transparent Film

① Film Thickness

DEKTAK 3030 (made by Sloan company) was used to measure the film thickness of the resultant transparent conductive oxide film by a tracer method.

② X-ray Diffraction Measurement

Rotor Flex RU-200B (made by Rigaku International Corp.) was used about the transparent conducitive oxide film to subject the film to X-ray diffraction measurement. As a result, it was proved that the transparent conductive oxide film was amorphous.

③ Inductive Coupling Plasma Emission Spectral Analysis

An inductive coupling plasma emission spectral analysis device SPS-1500VR (made by Seiko Instruments Inc.) was used to measure the atomic ratios In/(In+Zn) and Sn/(In+Zn+Sn) in the transparent conductive oxide film.

As a result, it was proved that the atomic ratios In/(In+Zn) and Sn/(In+Zn+Sn) were 0.93 and 0.08, respectively.

④ UV Spectrometry

The light transmittance (light wavelength: 500 or 550 nm) of the transparent conductive oxide film was measured with an UV spectrometric device U-3210 (made by Hitachi Ltd.).

⑤ Surface Resistance and Resistivity

A resistance measuring device Lorestor FP (made by Mitsubishi Chemical Corp.) was used to measure the surface resistance (initial surface resistance) of the transparent conductive oxide film, and measure the resistivity (initial resistivity $R_0$) thereof by a four-terminal method.

As a result, the initial surface resistance was 10.4$\Omega$/□ and the initial resistivity ($R_0$) was $2.6\times10^{-4}$ $\Omega$·cm.

⑥ Mobility of Carriers

RESITEST8200 (a measuring device based on van der Pauw's method, made by Toyo Technica company), which is a device for measuring Hall coefficients, was used to measure the mobility of carriers. As a result, it was proved that the mobility of the carriers in the transparent conductive oxide film was 27 cm$^2$/V·sec.

⑦ Heat Resistance Test

The resultant conductive transparent film was divided into two. One piece thereof was subjected to a heat resistance test.

That is, the conductive transparent film was allowed to stand still in the atmosphere at 90° C. for 1,000 hours. Thereafter, the resistivity ($R_{1000}$) of the transparent conductive oxide film was measured.

The resistance change rate, which is defined as a ratio [$R_{1000}/R_0$] of the resistivity after the heat resistance test ($R_{1000}$) to the initial resistivity ($R_0$), was calculated. As a result, this rate was as low as 1.10.

⑧ Etching Property Evaluation

About the other piece of the resultant conductive transparent film, the etching property thereof was evaluated using an aqueous solution having an oxalic acid concentration of 5% by weight and a temperature of 40° C. as an etching solution. As a result, it was proved that the etching rate (initial etching rate) of the transparent conductive oxide film was 0.2 $\mu$m/minute.

Example 10

A conductive transparent glass was obtained in the same way as in Example 9 except that #7059 made by Corning Inc. was used as a transparent substrate so that a non-alkali glass substrate was used. Conditions for forming the film herein and atomic ratios about constituent metals of the transparent conductive oxide film are shown in Table 5.

Evaluation results of the transparent conductive oxide film in the thus obtained conductive transparent glass are shown in Table 6.

The conductive transparent glass obtained herein was divided into 3 test pieces. About the two of these pieces, the initial surface resistance, the initial resistivity ($R_0$), the carrier mobility, the resistance change rate and the initial etching rate of the transparent conductive oxide film were measured in the same way as in Example 9.

The remaining piece was heated at 200° C. for 1 hour and subsequently the surface resistance and the etching rate of its transparent conductive oxide film were measured in the same way as in Example 9. The resistivity of the transparent conductive oxide film after the heating was calculated. Evaluation results of the transparent conductive oxide film after the heating are shown in Table 7.

Example 11

A conductive transparent glass was obtained in the same way as in Example 10 except that the temperature of the substrate was set to 215° C. Conditions for forming the film herein and atomic ratios about constituent metals of the transparent conductive oxide film are shown in Table 5.

Evaluation results of the transparent conductive oxide film in the obtained conductive transparent glass are shown in Table 6.

Furthermore, evaluation results of the transparent conductive oxide film after the heating are shown in Table 7.

Example 12

As a transparent substrate, the same polyester film as in Example 9 was used, and further a sintered body made of $In_2O_3(ZnO)_3$ which was a hexagonal layered compound (crystal grain size: 3.8 μm or less), $In_2O_3$ and $SnO_2$ [In/(In+Zn)=0.96, Sn/(In+Zn+Sn)=0.18, and relative density=97%] was used as a sputtering target. In this way, a conductive transparent film was produced.

A transparent conductive oxide film was formed on the polyester film in the same way as in Example 9 except that a mixed gas of argon gas (purity: 99.99%) and oxygen gas (concentration of oxygen gas=0.50%) was introduced thereto so as to have a pressure of $1\times10^{-1}$ Pa (oxygen partial pressure: $5\times10^{-4}$ Pa). Conditions for forming the film herein and the atomic ratios about constituent metals of the resultant transparent conductive oxide film are shown in Table 5.

Evaluations results of the transparent conductive oxide film in the resultant conductive transparent glass are shown in Table 6.

Furthermore, evaluation results of the transparent conductive oxide film after the heating are shown in Table 7.

Example 13

A conductive transparent glass was obtained in the same way as in Example 12 except that the same non-alkali glass substrate as in Example 10 was used as a transparent substrate. Conditions for forming the film herein and atomic ratios about constituent metals of the resultant transparent conductive oxide film are shown in Table 5.

Evaluation results of the transparent conductive oxide film in the resultant conductive transparent glass are shown in Table 6.

Furthermore, evaluation results of the transparent conductive oxide film after the heating are shown in Table 7.

Example 14

A conductive transparent glass was produced in the same way as in Example 9 except that as a transparent substrate, the same non-alkali glass substrate as in Example 10 was used, and further a sintered body made of $In_2O_3(ZnO)_3$ which was a hexagonal layered compound (crystal grain size: 3.6 μm), $In_2O_3$ and $SnO_2$ [In/(In+Zn)=0.91, Sn/(In+Zn+Sn)=0.10, and relative density=97%] was used as a sputtering target. Conditions for forming the film herein and the atomic ratios about constituent metals of the resultant transparent conductive oxide film are shown in Table 5.

Evaluations results of the transparent conductive oxide film in the resultant conductive transparent glass are shown in Table 6.

Furthermore, evaluation results of the transparent conductive oxide film after the heating are shown in Table 7.

Example 15

As a transparent substrate, the same polyester film as in Example 9 was used. An epoxy resin layer having a thickness of 1 μm was deposited on a surface thereof by spin coating. This epoxy resin was photo-cured by UV radiation, to form a crosslinked resin layer.

Next, a transparent conductive oxide film was deposited on this crosslinked resin layer in the same way as in Example 14. Thus, a conductive transparent film was obtained. Conditions for forming the film herein and the atomic ratios about constituent metals of the resultant transparent conductive oxide film are shown in Table 5.

Evaluations results of the transparent conductive oxide film in the resultant conductive transparent film are shown in Table 6.

Furthermore, evaluation results of the transparent conductive oxide film after the heating are shown in Table 7.

Example 16

As a transparent substrate, the same polyester film as in Example 9 was used, and further a sintered body made of $In_2O_3(ZnO)_3$ which was a hexagonal layered compound (crystal grain size: 3.8 μm), and $In_2O_3$ and $SnO_2$ [In/(In+Zn)=0.95, Sn/(In+Zn+Sn)=0.10, and relative density=98%] was used as a sputtering target. In this way, a conductive transparent film was produced. Conditions for forming the film herein and the atomic ratios about constituent metals of the resultant transparent conductive oxide film are shown in Table 5.

Evaluations results of the transparent conductive oxide film in the resultant conductive transparent film are shown in Table 6.

Furthermore, evaluation results of the transparent conductive oxide film after the heating are shown in Table 7.

Example 17

As a transparent substrate, the same polyester film as in Example 9 was used. A $SiO_2$ layer having a thickness of 100 nm was formed thereon by electron beam evaporation. Next, a transparent conductive oxide film was deposited on the surface of this $SiO_2$ resin layer in the same way as in Example 12. Thus, a conductive transparent film was obtained.

Conditions for forming the film herein and the atomic ratios about constituent metals of the resultant transparent conductive oxide film are shown in Table 5.

Evaluations results of the transparent conductive oxide film in the resultant conductive transparent film are shown in Table 6.

Furthermore, evaluation results of the transparent conductive oxide film after the heating are shown in Table 7.

Example 18

A conductive transparent glass was obtained in the same way as in Example 9 except that the same non-alkali glass substrate as in Example 10 was used as a transparent substrate, the temperature of this glass substrate was set to 215° C., and the amount of oxygen gas in the mixed gas at the time of sputtering was set to 3% (oxygen partial pressure: $3\times10^{-3}$ Pa).

Conditions for forming the film herein and atomic ratios about constituent metals of the transparent conductive oxide film are shown in Table 5.

Evaluation results of the transparent conductive oxide film in the obtained conductive transparent glass are shown in Table 6.

Furthermore, evaluation results of the transparent conductive oxide film after the heating are shown in Table 7.

Comparative Example 8

A conductive transparent glass was produced in the same way as in Example 9 except that as a transparent substrate, the same non-alkali glass substrate as in Example 10 was used, and further a sintered body made of a hexagonal layered compound (crystal grain size: 12 $\mu$m) represented by $In_2O_3(ZnO)_3$, and $In_2O_3$ [In/(In+Zn)=0.95, and relative density=80%] was used as a sputtering target.

Conditions for forming the film herein and the atomic ratios about constituent metals of the resultant transparent conductive oxide film are shown in Table 5.

The resultant conductive transparent glass was evaluated in the same was as in Example 9. The evaluation results are shown in Table 6.

It was proved from results of X-ray diffraction analysis that crystal of indium oxide was present in the transparent conductive oxide film after the transparent conductive oxide film formed herein was subjected to heat treatment.

Comparative Example 9

A conductive transparent glass was obtained in the same way as in Example 11 except that the same non-alkali glass substrate as in Example 10 was used as a transparent substrate and an ITO target [$In_2O_3$/5 at.% $SnO_2$] was used as a sputtering target.

It was proved from results of X-ray diffraction analysis that crystal of indium oxide was present in the transparent conductive oxide film of the resultant conductive transparent glass.

Conditions for forming the film herein and the atomic ratios about constituent metals of the resultant transparent conductive oxide film are shown in Table 5.

Furthermore, evaluation results of the conductive transparent glass are shown in Table 6.

Comparative Example 10

A conductive transparent glass was produced in the same way as in Example 11 except that as a transparent substrate, the same non-alkali glass substrate as in Example 10 was used, and further a sintered body made of $In_2O_3(ZnO)_3$ which was a hexagonal layered compound (crystal grain size: 8 $\mu$m or less), $In_2O_3$ and $SnO_2$ [In/(In+Zn)=0.98, Sn/(In+Zn+Sn)=0.05, and relative density=94%] was used as a sputtering target.

It was proved from results of X-ray diffraction analysis that crystal of indium oxide was present in the transparent conductive oxide film of the resultant conductive transparent glass.

Conditions for forming the film herein and the atomic ratios about constituent metals of the resultant transparent conductive oxide film are shown in Table 5.

Furthermore, the evaluation results of the conductive transparent glass are shown in Table 6.

TABLE 5

|  | | Material of the substrate | Substrate temperature (° C.) | Oxygen partial pressure (Pa) | In/(In + Zn) | Sn/(In + Zn + Sn) | Film thickness (nm) |
|---|---|---|---|---|---|---|---|
| Example | | | | | | | |
| | 9 | PET | 20 | $2.8 \times 10^{-4}$ | 0.93 | 0.08 | 250 |
| | 10 | Glass | 20 | $2.8 \times 10^{-4}$ | 0.93 | 0.08 | 200 |
| | 11 | Glass | 215 | $2.8 \times 10^{-4}$ | 0.93 | 0.08 | 100 |
| | 12 | PET | 20 | $5.0 \times 10^{-4}$ | 0.96 | 0.18 | 300 |
| | 13 | Glass | 20 | $5.0 \times 10^{-4}$ | 0.96 | 0.18 | 250 |
| | 14 | Glass | 20 | $5.0 \times 10^{-4}$ | 0.91 | 0.10 | 210 |
| | 15 | PET | 20 | $5.0 \times 10^{-4}$ | 0.91 | 0.10 | 200 |
| | 16 | PET | 20 | $1.0 \times 10^{-4}$ | 0.95 | 0.10 | 100 |
| | 17 | PET | 20 | $5.0 \times 10^{-4}$ | 0.95 | 0.10 | 100 |
| | 18 | Glass | 215 | $3.0 \times 10^{-4}$ | 0.95 | 0.10 | 100 |
| Comparative Example | | | | | | | |
| | 8 | Glass | 215 | $2.8 \times 10^{-4}$ | 0.95 | — | 100 |
| | 9 | Glass | 20 | $2.8 \times 10^{-4}$ | 1.00 | 0.05 | 100 |
| | 10 | Glass | 215 | $2.8 \times 10^{-4}$ | 0.98 | 0.05 | 100 |

TABLE 6

| | Light transmittance (%) | Initial surface resistance (Ω/□) | Initial resistivity (×10$^{-4}$ Ωcm) | Mobility (cm$^2$/V · sec) | Resistance change rate | Etching rate (μm/minute) |
|---|---|---|---|---|---|---|
| Example | | | | | | |
| 9 | 88 | 10.4 | 2.6 | 27 | 1.10 | 0.20 |
| 10 | 89 | 12.5 | 2.5 | 20 | 1.12 | 0.20 |
| 11 | 91 | 19.0 | 1.9 | 31 | 1.27 | 0.19 |
| 12 | 87 | 9.3 | 2.8 | 25 | 1.29 | 0.18 |
| 13 | 89 | 10.8 | 2.7 | 27 | 1.18 | 0.18 |
| 14 | 89 | 12.8 | 2.7 | 28 | 1.18 | 0.19 |
| 15 | 88 | 14.0 | 2.8 | 28 | 1.14 | 0.19 |
| 16 | 89 | 24.0 | 2.4 | 20 | 1.15 | 0.19 |
| 17 | 88 | 22.0 | 2.2 | 31 | 1.11 | 0.19 |
| 18 | 91 | 18.0 | 1.8 | 34 | 1.05 | 0.17 |
| Comparative Example | | | | | | |
| 8 | 79 | 43.2 | 4.3 | 18 | 1.14 | Unable to be etched |
| 9 | 89 | 17.5 | 1.8 | 32 | — | Unable to be etched |
| 10 | 89 | 640 | 64.0 | — | — | Unable to be etched |

TABLE 7

| | Initial Surface Resistance (Ω/□) | Initial Resistivity (×10$^{-4}$ Ωcm) | Etching rate (μm/minute) |
|---|---|---|---|
| Example | | | |
| 9 | — | — | — |
| 10 | 10.0 | 7.0 | 0.19 |
| 11 | 19.0 | 1.9 | 0.18 |
| 12 | — | — | — |
| 13 | 8.4 | 2.1 | 0.18 |
| 14 | 9.0 | 1.9 | 0.18 |
| 15 | — | — | — |
| 16 | — | — | — |
| 17 | — | — | — |
| 18 | 18.0 | 1.8 | 0.17 |

Example 19

(1) production of a transparent conductive material

Indium oxide powder having an average grain size of 1 μm, zinc oxide powder having an average grain size of 1 μm and tin oxide power having an average grain size of 0.5 μm were supplied to a wet ball mill in the manner that proportions of indium oxide, zinc oxide and tin oxide would be 80% by weight, 5% by weight and 15% by weight, respectively. Next, the powders were mixed and pulverized for 72 hours to yield fine ingredient powder.

Next, the powder was subjected to granulation and the grains were press-formed into a target form. The formed body was then fired at a temperature of 1,450° C. to yield a sintered body.

The relative density of the resultant sintered body (crystal grain size: 4.0 μm or less) was 98%, and the bulk resistance thereof was 0.83 mΩ·cm.

Next, a member for fitting to a sputtering machine was set up to this sintered body. This sintered body was used as a target. The used target was made to have a diameter of 10.16 cm.

This target was used to form a transparent conductive oxide film on a non-alkali glass substrate #7059 (made by Corning Inc.) by sputtering. That is, the non-alkali glass substrate #7059 was set up to an RF magnetron sputtering machine, and subsequently the pressure of its vacuum tank was reduced to 5×10$^{-4}$ Pa or less. Next, a mixed gas of argon gas and oxygen gas was introduced to have a pressure of 3×10$^{-1}$ Pa. The output of RF was set to 100 W. While substrate temperature was kept at room temperature, sputtering was performed to form a transparent conductive oxide film. In this way, a transparent conductive glass was obtained.

(2) Evaluation of the Target and the Transparent Conductive Oxide Film

The composition, the relative density, the bulk resistance and the crystallinity of the sintered body (target) obtained in the above-mentioned (1) were evaluated. The results are shown in Table 8.

Evaluated were the resistivity and the crystallinity obtained in the case in which the sintered body (target) obtained in the above-mentioned (1) was used to perform sputtering while the temperature of the transparent substrate was kept at room temperature, and the resistivity and the crystallinity obtained in the case in which the same target was used to perform sputtering while the temperature of the transparent substrate was kept at 200° C. The evaluation results thereof are shown in Table 9.

Rotor Flex RU-200B (made by Rigaku International Corp.), which is an X-ray diffraction analyzer, was used to analyze the crystallinity of the resultant transparent conductive oxide film. It was proved from an X-ray diffraction chart that it was amorphous.

The inductive coupling plasma emission spectral analysis device SPS-1500VR (made by Seiko Instruments Inc.) was used to analyze the composition of the transparent conductive oxide film.

The UV spectrometric device U-3210 (made by Hitachi Ltd.) was used to measure the light transmittance (light wavelength: 500 nm or 550 nm) of this conductive transparent glass.

The resistance measuring device Lorestor FP (made by Mitsubishi Chemical Corp.) was used to measure the surface resistance (referred to as the initial surface resistance hereinafter) of the transparent conductive oxide film, and measure the resistivity thereof by a four-terminal method.

Furthermore, DEKTAK 3030 (made by Sloan company) was used to measure the film thickness of the transparent conductive oxide film by a tracer method.

(3) Heat Treatment of the Transparent Conductive Oxide Film

About the transparent conductive glasses obtained in the above-mentioned (1), the transparent conductive oxide film formed in the state that the temperature of the transparent substrate was set to room temperature was subjected to heat treatment at 280° C. for 1 hour, and the transparent conductive oxide film formed in the state that the temperature of the transparent substrate was set to 200° C. was subjected to heat treatment at 250° C. for 1 hour. About the transparent conductive oxide films subjected to the heat treatment, their resistivity and crystallinity were evaluated. The evaluation results thereof are shown in Table 9.

Examples 20–22

(1) Production of Sintered Bodies and Transparent Conductive Oxide Films

In Examples 20–22, sintered bodies were obtained in the same way as in Example 19 except that the blend proportions of ingredients were changed as shown in Table 8.

Next, the respective obtained sintered bodies were used to produce transparent conductive oxide films in the same way as in Example 19.

The temperatures of transparent substrates at the time of the sputtering were set to temperatures shown in Table 9.

(2) Evaluation of the Sintered Bodies and the Transparent Conductive Oxide Films The sintered bodies and the transparent conductive oxide films obtained in the above-mentioned (1) were evaluated in the same way as in the (2) of Example 19. The results are shown in Tables 8 and 9.

(3) Heat Treatment of the Transparent Conductive Oxide Films

The transparent conductive oxide films obtained in the above-mentioned (1) were heat-treated in the same way as in the (3) of Example 19 except that the heat treatment temperature was changed as shown in Table 9. The results are shown in Table 9.

Comparative Examples 11–15

(1) Production of Sintered Bodies and Transparent Conductive Oxide Films

In Comparative Examples 11–15, sintered bodies were obtained in the same way as in Example 19 except that the blend proportions of ingredients were changed as shown in Table 8.

The following were used: indium oxide powder having an average grain size of 3 μm, zinc oxide powder having an average grain size of 3 μm, and tin oxide powder having an average grain size of 3 μm.

Next, the resultant sintered bodies were used to produce transparent conductive oxide films in the same way as in Example 19.

The temperatures of the transparent substrates at the time of the sputtering were set to temperatures shown in Table 9.

(2) Evaluation of the Sintered Bodies and the Transparent Conductive Oxide Films The sintered bodies and the transparent conductive oxide films obtained in the above-mentioned (1) were evaluated in the same way as in the (2) of Example 19. The results are shown in Tables 8 and 9.

(3) Heat Treatment of the Transparent Conductive Oxide Films

The transparent conductive oxide films obtained in the above-mentioned (1) were heat-treated in the same way as in the (3) of Example 19 except that the heat treatment temperature was changed as shown in Table 2. The results are shown in Table 9.

TABLE 8

|  | Example | | | | Comparative Example | | | | |
| --- | --- | --- | --- | --- | --- | --- | --- | --- | --- |
|  | 19 | 20 | 21 | 22 | 11 | 12 | 13 | 14 | 15 |
| $In_2O_3$ (% by weight) | 80 | 84 | 87 | 88 | 90 | 90 | 94 | 90 | 78 |
| $SnO_2$ (% by weight) | 15 | 12 | 10 | 10 | 10 | — | 5 | 5 | 15 |
| ZnO (% by weight) | 5 | 4 | 3 | 2 | — | 10 | 1 | 5 | 7 |
| Relative Density (%) | 98 | 97 | 98 | 99 | 98 | 98 | 97 | 96 | 97 |
| Bulk resistance (mΩ cm) | .83 | .84 | .70 | .65 | .87 | 2.4 | .87 | 2.1 | 2.4 |
| Target symbol | A4 | B4 | C4 | D4 | E4 | F4 | G4 | H4 | I4 |

TABLE 9

| | | | Transparent conductive oxide film immediately after the deposition thereof | | Transparent conductive oxide film after the heat treatment | | |
| --- | --- | --- | --- | --- | --- | --- | --- |
| | Target symbol | Substrate temperature (° C.) | Resistivity (μΩ · cm) | Crystallinity | Heat treatment temperature (° C.) | Resistivity (μΩ · cm) | Crystallinity |
| Example | | | | | | | |
| 19 | A4 | Room temperature | 290 | Amorphous | 280 | 180 | Crystalline |
| | A4 | 200 | 280 | Amorphous | 250 | 160 | Crystalline |
| 20 | B4 | Room temperature | 280 | Amorphous | 250 | 190 | Crystalline |
| 21 | C4 | Room | 230 | Amorphous | 230 | 190 | Crystalline |

TABLE 9-continued

| | Target symbol | Transparent Substrate temperature (° C.) | Transparent conductive oxide film immediately after the deposition thereof | | Transparent conductive oxide film after the heat treatment | | |
|---|---|---|---|---|---|---|---|
| | | | Resistivity ($\mu\Omega \cdot$ cm) | Crystallinity | Heat treatment temperature (° C.) | Resistivity ($\mu\Omega \cdot$ cm) | Crystallinity |
| 22 | D4 | Room temperature | 260 | Amorphous | 230 | 200 | Crystalline |
| Comparative Example | | | | | | | |
| 11 | E4 | Room temperature | 550 | Amorphous* | 230 | 180 | Crystalline |
| 12 | F4 | 200 | 380 | Amorphous | 300 | 1400 | Amorphous |
| 13 | G4 | Room temperature | 270 | Amorphous* | 300 | 190 | Crystalline |
| | G4 | 200 | 200 | Crystalline | — | — | — |
| 14 | H4 | Room temperature | 220 | Amorphous | 250 | 3200 | Crystalline |
| | H4 | 200 | 3600 | Crystalline | — | — | — |
| 15 | I4 | 200 | 380 | Amorphous | 230 | 370 | Amorphous |

*The symbol "*" indicates that fine crystal was contained.

Example 23

(1) Formation of a transparent conductive oxide film

Indium oxide powder having an average grain size of 1 µm, zinc oxide powder having an average grain size of 1 µm and tin oxide powder having an average grain size of 0.5 µm were mixed and pulverized in a wet ball mill in the manner that the precentages of indium oxide, zinc oxide and tin oxide would be 84.8% by weight, 5.2% by weight, and 10.0% by weight, respectively. Thereafter, the resultant was subjected to granulation, and the grains were press-formed to have a shape of a target. This was fired at 1, 450° C. to yield a sintered body (crystal grain size: 3.7 µm or less).

Next, a member for fitting to a sputtering machine was set up to the resultant sintered body. This sintered body was used as a target. The used target was made to have a diameter of 10.16 cm.

Next, this target was used to perform sputtering. As a transparent substrate, a non-alkali glass substrate #7059 (made by Corning Inc.) was used. As a sputtering machine, a magnetron sputtering machine of a parallel-plate type was used. The machine was evacuated into $5 \times 10^{-5}$ Pa. The water content in the vacuum chamber at this time was measured with a mass spectrometer. As a result, it was $8 \times 10^{-6}$ Pa.

Next, argon gas containing 1% by volume of oxygen gas was introduced into this machine. Sputtering pressure was adjusted into 0.3 Pa to perform sputtering. In this way, a film of a transparent conductive oxide was formed on the glass substrate. The thickness of the resultant transparent conductive oxide film was 1.2 nm.

In order to measure a binding energy peak of the oxygen 1S orbit by X-ray photoelectron spectroscopy, ESCA5400 made by Albackphy company was used and Mg-Kα was used as an X-ray source. As a detector, the electrostatic hemispheric type was used. Pass energy was set to 35.75 eV. $3d^{5/2}$ of indium was set to 444.4 eV to measure the criterion of the peak. About the half band width of the peak obtained herein, Shirley's equation was used to set a base line and calculate the value of the half band width.

As a result, the half band width of the binding energy band of the oxygen 1S orbit in the surface of the transparent conductive oxide film was 2.6 eV by the XPS method.

The measured binding energy peak of the oxygen 1S orbit in the surface of the transparent conductive oxide film, based on the XPS method, is shown in FIG. 12.

(2) Evaluation of the Transparent Conductive Oxide Film

The crystallinity, the light transmittance, the resistivity and the etching property of the transparent conductive oxide film obtained in the above-mentioned (1) were evaluated.

About the crystallinity of the transparent conductive oxide film, Rotor Flex RU-200B (made by Rigaku International Corp.) was used to check it by X-ray diffraction measurement.

The U-3210 (made by Hitachi Ltd.) was used to measure the light transmittance (light wavelength: 500 nm or 550 nm) of the transparent conductive oxide film including the glass substrate by UV spectrometry.

The Lorestor FP (made by Mitsubishi Chemical Corp.) was used to measure the surface resistance of the transparent conductive oxide film by a four-terminal method. The resistivity thereof was then calculated.

As an etching solution, an aqueous solution having an oxalic acid concentration of 3.4% by weight was used to measure the etching property at 40° C.

(3) Measurement of Connection Resistance

Next, the transparent conductive oxide film obtained in the above-mentioned (1) was etched into the form of stripe having a pitch of 110 µm and a gap of 20 µm, and subsequently an anisotropic conductive film was put on this transparent conductive oxide film in the stripe form, and heat-pressed thereon at 180° C. The connection resistance between the transparent conductive oxide film and the anisotropic conductive film was measured. The average value of this resistance was 8Ω.

In order to confirm long-term stability of this connection resistance, the test piece obtained by putting and heat-pressing the anisotropic conductive film on the transparent conductive oxide film was allowed to stand still in an oven, the temperature of which was kept at 95° C., for 120 hours and subsequently the connection resistance of the test piece was again measured. In this test piece, no change in the connection resistance was observed even after the long-term heat treatment.

The composition and evaluation results of the transparent conductive oxide film obtained herein are shown in Table 10.

Example 24

A target was produced and a film of a transparent conductive oxide film was formed in the same way as in Example 23 except that blend proportions of metal oxide components of ingredients were changed as follows: 87.3% by weight of indium oxide, 9.5% by weight of tin oxide and 3.2% by weight of zinc oxide. In this case, the water content in the vacuum chamber was $7 \times 10^{-6}$ Pa.

The half band width of the binding energy peak in the oxygen 1S orbit of the resultant transparent conductive oxide film was measured by the XPS method. As a result, it was 2.5 eV.

The composition and evaluation results of the transparent conductive oxide film are shown in Table 10.

Example 25

A target was produced and a film of a transparent conductive oxide was formed in the same way as in Example 23 except that blend proportions of metal oxide components of ingredients were changed as follows: 81.6% by weight of indium oxide, 12.2% by weight of tin oxide and 6.2% by weight of zinc oxide. In this case, the water content in the vacuum chamber was $9 \times 10^{-6}$ Pa.

The half band width of the binding energy peak of the oxygen 1S orbit of the resultant transparent conductive oxide film, which was measured by the XPS method, was 2.7 eV. The composition and evaluation results of this transparent conductive oxide film are shown in Table 10.

Comparative Example 16

A target (crystal grain size: 15 $\mu$m) was produced and a film of a transparent conductive oxide was formed in the same way as in Example 23 except that indium oxide powder having an average grain size of 3 $\mu$m, tin oxide powder having an average grain size of 3 $\mu$m, and zinc oxide powder having an average grain size of 3 $\mu$m were used and the blend proportions thereof were changed as follows: 88.7% by weight of indium oxide, 10.1% by weight of tin oxide and 1.2% by weight of zinc oxide.

In this case, the water content in the vacuum chamber was $9 \times 10^{-6}$ Pa.

The half band width of the binding energy peak of the oxygen 1S orbit of the resultant transparent conductive oxide film, which was measured by the XPS method, was 2.9 eV.

The etching rate of the transparent conductive oxide film obtained herein was as small as 4.4 angstrom/second.

The composition and evaluation results of this transparent conductive oxide film are shown in Table 10.

Comparative Example 17

A target (crystal grain size: 11 $\mu$m) was produced in the same way as in Example 23 except that indium oxide powder having an average grain size of 3 $\mu$m, tin oxide powder having an average grain size of 3 $\mu$m, and zinc oxide powder having an average grain size of 3 $\mu$m were used and the blend proportions thereof were changed as follows: 84.8% by weight of indium oxide, 10.0% by weight of tin oxide and 5.2% by weight of zinc oxide.

Next, the vacuum chamber was evacuated into $2 \times 10^{-5}$ Pa at the initial time of the sputtering. The pressure was adjusted into 0.3 Pa with argon gas containing 1% by volume of oxygen gas. Thereafter, the water content in the vacuum chamber was adjusted into $9 \times 10^{-4}$ Pa. In the same way as in Example 23 except these operations, a film of a transparent conductive oxide was formed.

The half band width of the binding energy peak of the oxygen 1S orbit in the resultant transparent conductive oxide film was 3.3 eV.

The resultant transparent conductive oxide film was heat-treated at 95° C. for 120 hours. As a result, the connection resistance increased to a great degree.

The composition and evaluation results of this transparent conductive oxide film are shown in Table 10.

Comparative Example 18

A target (crystal grain size: 14 $\mu$m) was produced and a film of a transparent conductive oxide was formed in the same way as in Example 23 except that indium oxide powder having an average grain size of 3 $\mu$m, tin oxide powder having an average grain size of 3 $\mu$m, and zinc oxide powder having an average grain size of 3 $\mu$m were used and the blend proportions thereof were changed as follows: 83.4% by weight of indium oxide, 4.3% by weight of tin oxide and 12.3% by weight of zinc oxide. In this case, the water content in the vacuum chamber was $1 \times 10^{-7}$ Pa.

The half band width of the binding energy peak of the oxygen 1S orbit in the resultant transparent conductive oxide film was 3.8 eV. The measured binding energy peak, measured by the XPS method, of the oxygen 1S orbit in the surface of the resultant transparent conductive oxide film is shown in FIG. 13.

The resultant transparent conductive oxide film was heat-treated at 95° C. for 120 hours. As a result, the connection resistance increased to a great degree.

The composition and evaluation results of this transparent conductive oxide film are shown in Table 10.

Comparative Example 19

A target (crystal grain size: 18 $\mu$m) was produced in the same way as in Example 23 except that indium oxide powder having an average grain size of 3 $\mu$m, and tin oxide powder having an average grain size of 3 $\mu$m were used and the blend proportions thereof were changed as follows: 90.0% by weight of indium oxide, and 10.0% by weight of tin oxide.

Next, the vacuum chamber was evacuated into $2 \times 10^{-5}$ Pa at the initial time of the sputtering. The pressure was adjusted into 0.3 Pa with argon gas containing 1% by volume of oxygen gas. Thereafter, the water content in the vacuum chamber was adjusted into $9 \times 10^{-4}$ Pa. In the same way as in Example 23 except these operations, a film of a transparent conductive oxide was formed.

The half band width of the binding energy peak of the oxygen 1S orbit of the thus obtained transparent conductive oxide film was 3.4 eV.

The resultant transparent conductive oxide film was heat-treated at 95° C. for 120 hours. As a result, the connection resistance increased to a great degree.

The composition and evaluation results of this transparent conductive oxide film are shown in Table 10.

TABLE 10

| | Example | | | Comparative Example | | | |
|---|---|---|---|---|---|---|---|
| | 23 | 24 | 25 | 16 | 17 | 18 | 19 |
| Composition | | | | | | | |
| $In_2O_3$ (% by weight) | 84.8 | 87.3 | 81.6 | 88.7 | 84.8 | 83.4 | 90.0 |
| $SnO_2$ (% by weight) | 10.0 | 9.5 | 12.2 | 10.1 | 10.0 | 4.3 | 10.0 |
| ZnO (% by weight) | 5.2 | 3.2 | 6.2 | 1.2 | 5.2 | 12.3 | — |
| Water content ($\times 10^{-6}$ Pa) | 8 | 7 | 9 | 9 | 20 | 0.1 | 900 |
| Half band width (Ev) | 2.6 | 2.5 | 2.7 | 2.9 | 3.3 | 3.8 | 3.4 |
| Crystal evaluation | Amorphous | Amorphous | Amorphous | Amorphous | Amorphous | Amorphous | Amorphous |
| Light transmittance (%) | 81 | 81 | 82 | 81 | 81 | 80 | 81 |
| Resistivity ($\mu\Omega$m) | 240 | 220 | 240 | 280 | 490 | 370 | 560 |
| Etching rate ($\mu$m/60 sec.) | 0.09 | 0.06 | 0.09 | 0.03 | 0.10 | 0.11 | 0.06 |
| Initial Contact resistance ($\Omega$) | 8 | 10 | 12 | 11 | 14 | 16 | 34 |
| Contact resistance after the Heat treatment ($\Omega$) | 8 | 10 | 12 | 11 | 38 | 54 | 78 |

*The word "Amorphous" in the crystal evaluation indicates an amorphous state.

Example 26

(1) Formation of an Organic Colored Layer on a Substrate

A glass substrate was used as a substrate to form a light shading layer made of chromium oxide on a surface thereof. The formation of the light shading layer was performed by sputtering, and the thickness of the chromium oxide layer was set to 0.1 $\mu$m.

Next, the light shading layer was worked into the form of a lattice having a line width of 30 $\mu$m by photolithography. The pitch thereof along one direction was 110 $\mu$m, and the pitch thereof along the direction perpendicular thereto was 330 $\mu$m.

Next, a phthalocyanine green pigment (Color Index No 74160 Pigment Green 36) was used as a green pigment, and a paste wherein it was dispersed in and mixed with a transparent polyimide precursor solution Semicofine SP-910 (made by Toray Industries, Inc.) was applied to the chromium oxide layer in the lattice form. This was semi-cured to form a green organic colored layer in the form of stripe having a width of 90 $\mu$m and a pitch of 330 $\mu$m, which corresponded to pixels. Thereafter, this was cured. The thickness of this green organic colored layer was set to 1.5 $\mu$m.

As a red pigment, a quinacridon pigment (Color Index No 73905 Pigment Red 209) was used, and as a blue pigment, a phthalocyanine blue pigment (Color Index No 74160 Pigment Blue 15-4) was used. From pastes obtained by dispersing/mixing these in/with the above-mentioned polyimide precursor solutions, respectively, a red organic colored layer and a blue organic colored layer were formed in the same way as above.

By applying the above-mentioned polyimide precursor solution onto these organic colored layers and curing the applied layer, a protective layer having a thickness of 2 $\mu$m was formed.

(2) Formation of a Transparent Conductive Film

A transparent conductive film (transparent conductive oxide film) was formed on the organic colored layers of the glass substrate having the organic colored layers obtained in the above-mentioned (1) by sputtering.

A sputtering target used herein was produced as follows. That is, a mixture of 80% by weight of indium oxide powder, 15% by weight of tin oxide powder and 5% by weight of zinc oxide was mixed and pulverized in a wet ball mill. Thereafter, the resultant was subjected to granulation, and the grains were press-formed. The resultant was sintered in pressured oxygen gas in a firing furnace at 1,450° C. for 36 hours to yield a target [A6] having a crystal grain size of 4.0 $\mu$m.

The resultant target [A6] was fitted to the DC magnetron sputtering machine, and then a transparent conductive film was formed on the organic colored layer of the glass substrate by sputtering.

About sputtering conditions in this case, argon gas into which an appropriate amount of oxygen gas was incorporated was used as atmosphere, and sputtering pressure, attainment pressure, substrate temperature, applied electric power, and film-forming time were $3\times10^{-1}$ Pa, $5\times10^{-4}$ Pa, 25° C., 100 W, and 20 minutes, respectively.

As a result thereof, a transparent conductive film having a film thickness of about 120 nm was formed on the organic colored layer.

The crystallinity of this transparent conductive film was observed by X-ray diffraction analysis. As a result, it was proved that the film was amorphous.

Substrate temperature was set to 180° C. at the time of sputtering to form a transparent conductive film on the organic colored layer of another glass substrate. This transparent conductive film was also amorphous.

The ingredient composition and physical properties of the transparent conductive film are shown in Table 11.

(3) Evaluation of the Etching Property of the Transparent Conductive Film

The etching property of the resultant transparent conductive film was evaluated.

That is, parts of the transparent conductive film formed on the organic colored layer were etched at 40° C. with an aqueous solution containing an oxalic acid concentration of 5% by weight, and then a section in the boundary portion between etched portions and non-etched portions was observed with an electron microscope.

As a result, it was found out that no transparent conductive film remained in the etched portions, and the edge portion of the transparent conductive film remaining in the non-etched portions had a sectional shape inclined smoothly toward the etched portions.

Thus, it was proved that the resultant transparent conductive film had good workability even in etching using a weak acid.

When the etching workability of this transparent conductive film was evaluated, evaluation criteria described in Example 4 were adopted. The evaluation results are shown in Table 2.

(4) Crystallization of the Transparent Conductive Film by Heat Treatment

Next, the transparent conductive film formed on the organic colored layer of the glass substrate and obtained in the above-mentioned (2) was subjected to heat treatment.

About heat treatment conditions in this case, the film was heated to 230° C. at a temperature-rising rate of 20° C./minute in the atmosphere of argon gas. The time for keeping 230° C. was set to 1 hour.

The transparent conductive film subjected to this heat treatment was crystalline, and the resistivity thereof measured by a four-probe method was $230 \times 10^{-6}$ Ω·cm.

Furthermore, about the transparency of this transparent conductive oxide film, the light transmittance about light having a wavelength of 500 nm was 82% according to a spectrometer. Thus, the transparency was also superior.

Bad effects by this heat treatment, such as thermal deterioration of the organic colored layer, were not observed.

Example 27

(1) Formation of a Transparent Conductive Film

A target [B6] (crystal grain size: 4.0 μm) was produced in the same way as in the (2) of Example 26 except that on an organic colored layer of a glass substrate having the organic colored layer obtained in the same way as in the (1) of Example 26, a mixture of 84% by weight of indium oxide powder, 12% by weight of tin oxide powder, and 4% by weight of zinc oxide powder was used as the ingredient of a sputtering target. This target was used to form a transparent conductive film.

The ingredient composition thereof and physical properties thereof are shown in Table 11.

(2) Evaluation of the Etching Property of the Transparent Conductive Film

The etching property of the transparent conductive film obtained in the above-mentioned (1) was evaluated in the same way as in the (3) of Example 26. The results are shown in Table 12.

(3) Crystallization of the Transparent Conductive Film by Heat Treatment and Evaluation of the Transparent Conductive Film Next, heat treatment of the transparent conductive film obtained in the above-mentioned (1) was performed in the same way as in the (4) of Example 26, so as to yield a transparent conductive film. The results are shown in Table 12.

Example 28

(1) Formation of a Transparent Conductive Film

A target [C6] (crystal grain size: 4.1 μm) was produced in the same way as in the (2) of Example 26 except that on an organic colored layer of a glass substrate having the organic colored layer obtained in the same way as in the (1) of Example 26, a mixture of 87% by weight of indium oxide powder, 10% by weight of tin oxide powder, and 2% by weight of zinc oxide powder was used as the ingredient of a sputtering target. This target was used to form a transparent conductive film.

The ingredient composition thereof and physical properties thereof are shown in Table 11.

(2) Evaluation of the Etching Property of the Transparent Conductive Film

The etching property of the transparent conductive film obtained in the above-mentioned (1) was evaluated in the same way as in the (3) of Example 26. The results are shown in Table 12.

(3) Crystallization of the Transparent Conductive Film by Heat Treatment

Next, heat treatment of the transparent conductive film obtained in the above-mentioned (1) was performed in the same way as in the (4) of Example 26. The results are shown in Table 12.

Example 29

(1) Formation of a Transparent Conductive Film

A target [D6] (crystal grain size: 4.0 μm) was produced in the same way as in the (2) of Example 26 except that on an organic colored layer of a glass substrate having the organic colored layer obtained in the same way as in the (1) of Example 26, a mixture of 88% by weight of indium oxide powder, 10% by weight of tin oxide powder, and 2% by weight of zinc oxide powder was used as the ingredient of a sputtering target. This target was used to form a transparent conductive film.

The ingredient composition thereof and physical properties thereof are shown in Table 11.

(2) Evaluation of the Etching Property of the Transparent Conductive Film

The etching property of the transparent conductive film obtained in the above-mentioned (1) was evaluated in the same way as in the (3) of Example 26. The results are shown in Table 12.

(3) Crystallization of the Transparent Conductive Film by Heat Treatment

Next, heat treatment of the transparent conductive film obtained in the above-mentioned (1) was performed in the same way as in the (4) of Example 26. The results are shown in Table 12.

Comparative Example 20

(1) Formation of a Transparent Conductive Film

A target [E6] (crystal grain size: 1.2 μm) which was made from a mixture of 90% by weight of indium oxide powder and 10% by weight of tin oxide powder and contained no zinc oxide powder was used to form a transparent conductive film on an organic colored layer of a glass substrate having the organic colored layer obtained in the same way as in the (1) of Example 26.

The crystallinity of the transparent conductive film obtained herein was observed by X-ray diffraction analysis. As a result, it was crystalline.

The ingredient composition thereof and physical properties thereof are shown in Table 11.

(2) Evaluation of the Etching Property of the Transparent Conductive Film

The etching property of the transparent conductive film obtained in the above-mentioned (1) was evaluated in the same way as in the (3) of Example 26. The results are shown in Table 12.

(3) Heat Treatment of the Transparent Conductive Film

Next, heat treatment of the transparent conductive film obtained in the above-mentioned (1) was performed in the same way as in the (4) of Example 26. The results are shown in Table 12.

Comparative Example 21

(1) Formation of a Transparent Conductive Film

A target [F6] (crystal grain size: 18 μm) was produced in the same way as in the (2) of Example 26 except that on an organic colored layer of a glass substrate having the organic colored layer obtained in the same way as in the (1) of Example 26, a mixture of 90% by weight of indium oxide powder and 10% by weight of zinc oxide powder having an average grain size over 3 μm was used as the ingredient of a sputtering target. This target was used to form a transparent conductive film.

The crystallinity of the transparent conductive film obtained herein was observed by X-ray diffraction analysis. As a result, it was amorphous. The ingredient composition thereof and physical properties thereof are shown in Table 11.

(2) Evaluation of the Etching Property of the Transparent Conductive Film

The etching property of the transparent conductive film obtained in the above-mentioned (1) was evaluated in the same way as in the (3) of Example 26. The results are shown in Table 12.

(3) Heat Treatment of the Transparent Conductive Film

Next, heat treatment of the transparent conductive film obtained in the above-mentioned (1) was performed in the same way as in the (4) of Example 26. The results are shown in Table 12.

Comparative Example 22

(1) Formation of a Transparent Conductive Film

A target [G6] (crystal grain size: 15 μm) was produced in the same way as in the (2) of Example 26 except that on an organic colored layer of a glass substrate having the organic colored layer obtained in the same way as in the (1) of Example 26, a mixture of 94% by weight of indium oxide powder having an average grain size over 3 μm, 5% by weight of tin oxide powder having an average grain size over 3 μm and 1% by weight of zinc oxide powder having an average grain size over 3 μm was used as the ingredient of a sputtering target. This target was used to form a transparent conductive film.

The crystallinity of the transparent conductive film obtained herein was observed by X-ray diffraction analysis. As a result, it was amorphous.

This target [G6] was used to form a transparent conductive film in the state that substrate temperature at the time of sputtering was set to 200° C.

The resultant transparent conductive film was crystalline. The ingredient composition thereof and physical properties thereof are shown in Table 11.

(2) Evaluation of the Etching Property of the Transparent Conductive Film

The etching property of the transparent conductive film obtained in the above-mentioned (1) was evaluated in the same way as in the (3) of Example 26. The results are shown in Table 12.

(3) Heat Treatment of the transparent Conductive Film

Next, heat treatment of the transparent conductive film formed by setting the substrate temperature to room temperature was performed in the same way as in the (4) of Example 26. The results are shown in Table 12.

Comparative Example 23

(1) Formation of a Transparent Conductive Film

A target [H6] (crystal grain size: 17 μm) made from a mixture of 90% by weight of indium oxide powder having an average grain size over 3 μm, 5% by weight of tin oxide powder having an average grain size over 3 μm and 5% by weight of zinc oxide powder having an average grain size over 3 μm was used to form a transparent conductive film on an organic colored layer of a glass substrate having the organic colored layer obtained in the same way as in the (1) of Example 26.

The crystallinity of the transparent conductive film resultant was observed by X-ray diffraction analysis. As a result, it was amorphous.

This target [H6] was used to form a transparent conductive film in the state that substrate temperature at the time of sputtering was set to 200° C.

The resultant transparent conductive film was crystalline. The ingredient composition thereof and physical properties thereof are shown in Table 11.

(2) Evaluation of the Etching Property of the Transparent Conductive Film

The etching property of the transparent conductive film obtained in the above-mentioned (1) was evaluated in the same way as in the (3) of Example 26. The results are shown in Table 12.

(3) Heat Treatment of the Transparent Conductive Film

Next, heat treatment of the transparent conductive film formed by setting the substrate temperature to room temperature was performed in the same way as in the (4) of Example 26. The results are shown in Table 12.

TABLE 11

|  | Example | | | | Comparative Example | | | |
| --- | --- | --- | --- | --- | --- | --- | --- | --- |
|  | 26 | 27 | 28 | 29 | 20 | 21 | 22 | 23 |
| $In_2O_3$ (% by weight) | 80 | 84 | 87 | 88 | 90 | 90 | 94 | 90 |
| $SnO_2$ (% by weight) | 15 | 12 | 10 | 10 | 10 | — | 5 | 5 |
| ZnO (% by weight) | 5 | 4 | 3 | 2 | — | 10 | 1 | 5 |
| Relative Density (%) | 98 | 97 | 98 | 99 | 98 | 98 | 97 | 96 |
| Bulk resistance (mΩcm) | 0.83 | 0.84 | 0.70 | 0.65 | 0.87 | 2.43 | 0.87 | 2.1 |
| Target symbol | A6 | B6 | C6 | D6 | E6 | F6 | G6 | H6 |

TABLE 12

| Target symbol | | Substrate temperature (° C.) | Transparent conductive film after the deposition thereof | | | Transparent conductive film after the heat treatment | | |
|---|---|---|---|---|---|---|---|---|
| | | | Resistivity ($\mu\Omega \cdot$ cm) | Crystal evaluation | Etching property | Temperature (° C.) | Resistivity ($\mu\Omega \cdot$ cm) | Crystal evaluation |
| Example | | | | | | | | |
| 26 | A6 | Room temperature | 290 | Amorphous | ○ | 230 | 230 | Crystalline |
| | A6 | 180 | 280 | Amorphous | ○ | 230 | 210 | Crystalline |
| 27 | B6 | Room temperature | 280 | Amorphous | ○ | 230 | 220 | Crystalline |
| 28 | C6 | Room temperature | 230 | Amorphous | ○ | 230 | 210 | Crystalline |
| 29 | D6 | Room temperature | 260 | Amorphous | ○ | 250 | 200 | Crystalline |
| Comparative Example | | | | | | | | |
| 20 | E6 | Room temperature | 550 | Amorphous | Δ | 230 | 180 | Crystalline |
| 21 | F6 | 200 | 380 | Amorphous | ○ | 250 | 370 | Amorphous |
| 22 | G6 | Room temperature | 270 | Amorphous | Δ | 250 | 230 | Crystalline |
| | G6 | 200 | 200 | Crystalline | x | — | — | — |
| 23 | H6 | Room temperature | 220 | Amorphous | Δ | 250 | 3200 | Crystalline |
| | H6 | 200 | 3600 | Crystalline | x | — | — | — |

*The word "Amorphous" in the crystal evaluation indicates an amorphous state.
*The word "Crystalline" in the crystal evaluation indicates a crystalline state.

Industrial Applicability

As described in detail above, according to the sputtering target of the present invention, the generation of nodules when a transparent conductive oxide is formed into a film by sputtering can be effectively suppressed by controlling the crystal grain size thereof into a given value or more. Thus, the sputtering can be stably performed for a long time.

According to the process for producing a sputtering target of the present invention, it becomes possible to supply effectively a target making it possible to suppress the generation of nodules when a transparent conductive oxide is formed into a film.

According to the transparent conductive oxide of the present invention, superior conductivity and transparency can be gained and further smooth surface property can be gained.

What is claimed is:

1. A sputtering target comprising at least indium oxide and zinc oxide,
wherein the atomic ratio represented by In/(In+Zn) is set to a value within the range of 0.75 to 0.97, and further, a hexagonal layered compound represented by $In_2O_3(ZnO)_m$ wherein m is an integer of 2 to 20 is contained, and the crystal grain size of the hexagonal layered compound is set to a value of 5 $\mu$m or less.

2. The sputtering target according to claim 1, wherein 67 to 93% by weight of indium oxide, 5 to 25% by weight of tin oxide and 2 to 8% by weight of zinc oxide are contained, and the atomic ratio of tin to zinc is set to a value of 1 or more.

3. The sputtering target according to claim 1, wherein a spinel structural compound represented by $Zn_2SnO_4$ is contained together with the hexagonal layered compound, and the crystal grain size of the spinel structural compound is set to a value of 5 $\mu$m or less.

4. The sputtering target according to claim 1, wherein the bulk resistance thereof is set to a value less than $1\times10^{-3}$ $\Omega \cdot$cm.

5. The sputtering target according to claim 1, wherein the density thereof is set to a value of 6.7 g/cm$^3$ or more.

6. The sputtering target according to claim 1, wherein the atomic ratio represented by In/(In+Zn) is set to a value within the range of 0.85 to 0.95.

7. The sputtering target according to claim 1, wherein the crystal grain size of the hexagonal layered compound ranges from about 0.1 to about 4 $\mu$m.

8. The sputtering target according to claim 7, wherein the crystal grain size of the hexagonal layered compound ranges from about 0.5 to about 3 $\mu$m.

9. A transparent conductive oxide comprising a sputtering target wherein the atomic ratio represented by In/(In+Zn) is set to a value within the range of 0.75 to 0.97, a hexagonal layered compound represented by $In_2O_3(ZnO)_m$ wherein m is an integer of 2 to 20 is contained, and the crystal grain size of the hexagonal layered compound is set to a value of 5 $\mu$m or less.

10. The transparent conductive oxide according to claim 9, wherein the transparent conductive oxide is formed on a substrate or on a colored layer disposed on the substrate.

11. The transparent conductive oxide according to claim 9, wherein the P-V value thereof according to JIS B0610 is set to a value of 1 $\mu$m or less.

12. The transparent conductive oxide according to claim 9, wherein 67 to 93% by weight of indium oxide, 5 to 25% by weight of tin oxide and 2 to 8% by weight of zinc oxide are contained in the sputtering target, and the atomic ratio of tin to zinc is set to 1 or more.

13. The transparent conductive oxide according to claim 9, wherein the transparent conductive oxide is crystallized at a temperature of 230° C. or higher.

14. The transparent conductive oxide according to claim 9, wherein the half band width of a binding energy peak of the oxygen 1S orbit measured by X-ray photoelectron spectrometer is set to a value of 3 eV or less.

15. The transparent conductive oxide according to claim 9, wherein the crystal grain size of the hexagonal layered compound ranges from about 0.1 to about 4 $\mu$m.

16. The transparent conductive oxide according to claim 15, wherein the crystal grain size of the hexagonal layered compound ranges from about 0.5 to about 3 μm.

17. A sputtering target comprising at least indium oxide and zinc oxide,
wherein the atomic ratio represented by In/(In+Zn) is set to a value within the range of 0.75 to 0.97, and further,
a spinel structural compound represented by $Zn_2SnO_4$ is contained, and the crystal grain size of the spinel structural compound is set to a value of 5 μm or less.

18. A process for producing a sputtering target containing a hexagonal layered compound represented by $In_2O_3(ZnO)_m$ wherein m is an integer of 2 to 20, the crystal grain size of the hexagonal layered compound being a value of 5 μm or less, comprising the steps (1) to (5):
(1) producing a hexagonal layered compound represented by $In_2O_3(ZnO)_m$ wherein m is an integer of 2 to 20,
(2) adjusting the produced hexagonal layered compound to have a grain size of 5 μm or less,
(3) blending the hexagonal layered compound having the adjusted grain size with indium oxide powder,
(4) making a formed body wherein the atomic ratio of In/(In+Zn) is within the range of 0.75 to 0.97, and
(5) sintering the formed body at a temperature of 1,400° C. or higher in an oxygen gas or pressured oxygen gas atmosphere.

19. A process for producing a sputtering target containing a hexagonal layered compound represented by $In_2O_3(ZnO)_m$ wherein m is an integer of 2 to 20, the crystal grain size of the hexagonal layered compound being a value of 5 μm or less, comprising the steps (1) to (3):
(1) blending indium oxide powder with zinc oxide powder having an average grain size of 2 μm or less,
(2) making a formed body wherein the atomic ratio of In/(In+Zn) is within the range of 0.75 to 0.97, and
(3) sintering the formed body at a temperature of 1,400° C. or higher in an oxygen gas or pressured oxygen gas atmosphere.

20. The process for producing the sputtering target according to claim 19, wherein in the step (1) 67 to 93% by weight of indium oxide, 5 to 25% by weight of tin oxide and 2 to 8% by weight of zinc oxide are blended, and in the step (2) the formed body wherein the atomic ratio of tin to zinc is 1 or more is formed.

21. The process for producing the sputtering target according to claim 19, wherein the average grain size of the indium oxide powder is set to a value within the range of 0.1 to 2 μm.

22. The process for producing the sputtering target according to claim 19, wherein tin oxide powder is further blended together with the indium oxide powder and the average grain size of the tin oxide powder is set to a value within the range of 0.01 to 1 μm.

23. The process for producing the sputtering target according to claim 19, wherein when the formed body is formed, a spinel compound whose grain size is adjusted to 5 μm or less is further blended.

* * * * *